US009099202B2

(12) United States Patent
Mihnea et al.

(10) Patent No.: US 9,099,202 B2
(45) Date of Patent: Aug. 4, 2015

(54) 3D STACKED NON-VOLATILE STORAGE PROGRAMMING TO CONDUCTIVE STATE

(71) Applicant: SanDisk Technologies Inc., Plano, TX (US)

(72) Inventors: Andrei Mihnea, San Jose, CA (US); Xiying Costa, San Jose, CA (US); Yanli Zhang, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 344 days.

(21) Appl. No.: 13/670,233

(22) Filed: Nov. 6, 2012

(65) Prior Publication Data

US 2014/0126291 A1   May 8, 2014

(51) Int. Cl.
G11C 11/56 (2006.01)
G11C 16/10 (2006.01)
H01L 27/11 (2006.01)
G11C 16/04 (2006.01)
H01L 27/115 (2006.01)

(52) U.S. Cl.
CPC ............ G11C 11/5671 (2013.01); G11C 16/10 (2013.01); H01L 27/11582 (2013.01); G11C 16/0483 (2013.01); H01L 27/1157 (2013.01)

(58) Field of Classification Search
CPC .............. G11C 16/06; G11C 16/0466; G11C 16/0483; G11C 16/10; G11C 16/24; G11C 16/12; G11C 11/5671; H01L 27/11582; H01L 27/1157
USPC ............. 365/185.17, 185.05, 185.24, 185.18, 365/185.23
See application file for complete search history.

(56) References Cited

U.S. PATENT DOCUMENTS 4,939,690 A   7/1990  Momodomi
7,558,141 B2   7/2009  Katsumata et al.
7,852,675 B2  12/2010  Maejima
8,102,711 B2   1/2012  Maejima
(Continued)

FOREIGN PATENT DOCUMENTS

EP    1638110 A   7/1990
TW    I220526 B   8/2004

OTHER PUBLICATIONS

Aritome, et al., "Reliability Issues of Flash Memory Cells," Proceedings of the IEEE, vol. 81, No. 5, May 1993, pp. 776-788, 13 pages.
(Continued)

Primary Examiner — J. H. Hur
(74) Attorney, Agent, or Firm — Vierra Magen Marcus LLP

(57) ABSTRACT

Programming NAND strings in a 3D stacked storage device to a conductive state. Storage elements may be erased by raising their Vt and programmed by lowering their Vt. Programming may include applying a series of increasing voltages to selected bit lines until the selected memory cell is programmed. Unselected bit lines may be held at about ground, or close to ground. The selected word line may be grounded, or be held close to ground. Unselected word lines between the selected word line and the bit line may receive about the selected bit line voltage. Unselected word lines between the source line and the selected word line may receive about half the selected bit line voltage. Programming may be achieved without boosting channels of unselected NAND strings to inhibit them from programming. Therefore, program disturb associated with leakage of boosted channel potential may be avoided.

22 Claims, 25 Drawing Sheets

(56) References Cited

U.S. PATENT DOCUMENTS

| | | |
|---|---|---|
| 2006/0140000 A1 | 6/2006 | Liao |
| 2007/0252201 A1 | 11/2007 | Kito et al. |
| 2009/0109761 A1 | 4/2009 | Jin |
| 2009/0268523 A1 | 10/2009 | Maejima |
| 2009/0279360 A1 | 11/2009 | Lee |
| 2010/0159657 A1 | 6/2010 | Arai et al. |
| 2010/0195395 A1 | 8/2010 | Jeong et al. |
| 2012/0069667 A1 | 3/2012 | Shirakawa |
| 2012/0195128 A1 | 8/2012 | Fujiwara |

OTHER PUBLICATIONS

International Search Report and Written Opinion for PCT/US2013/068041, mailed Aug. 18, 2014.

English Abstract of Taiwan Publication No. TWI 220526 published on Aug. 21, 2004.

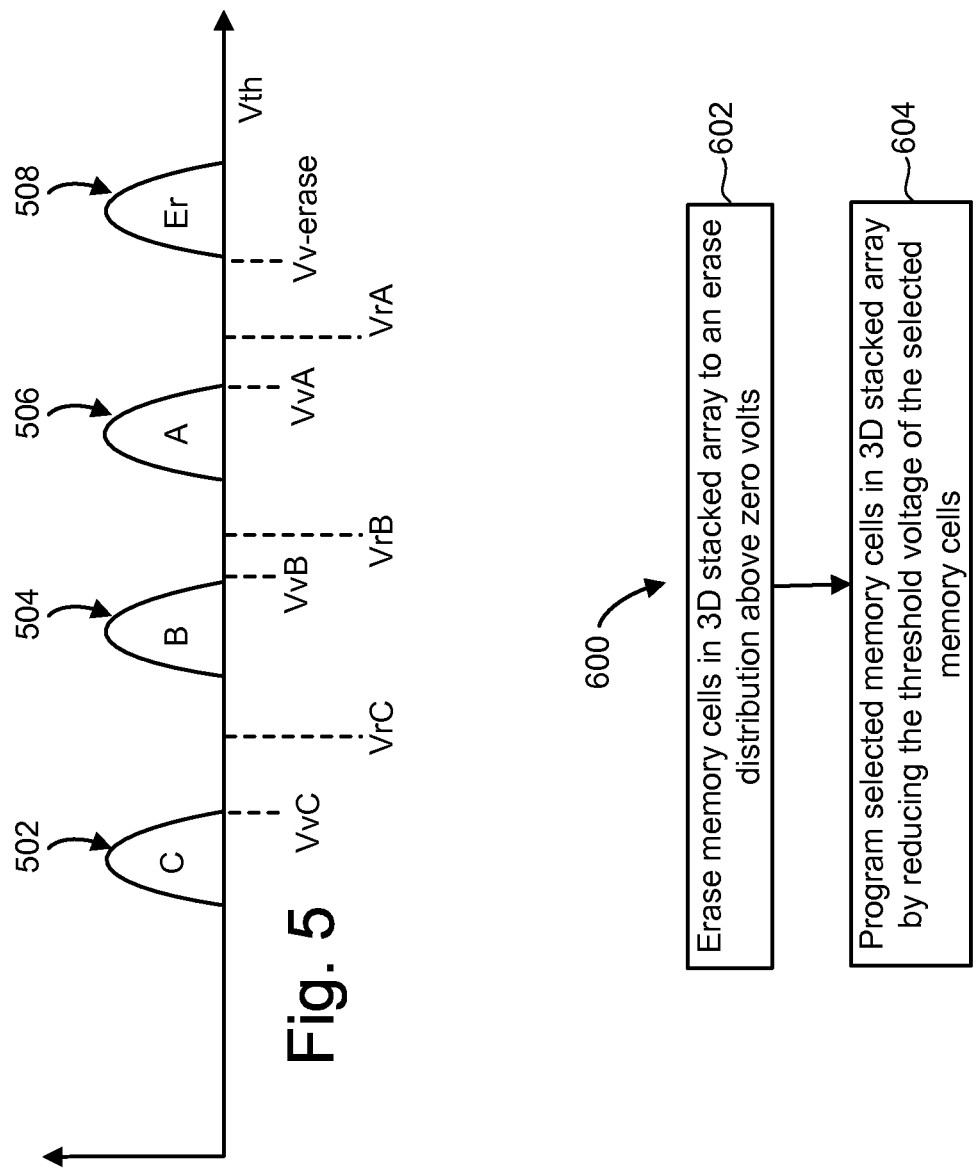

Fig. 11C
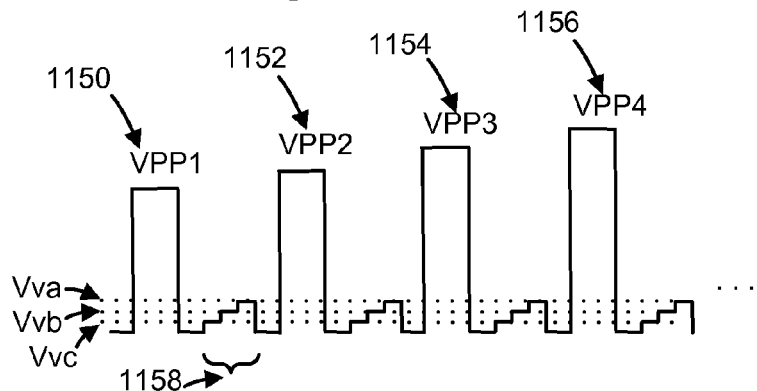
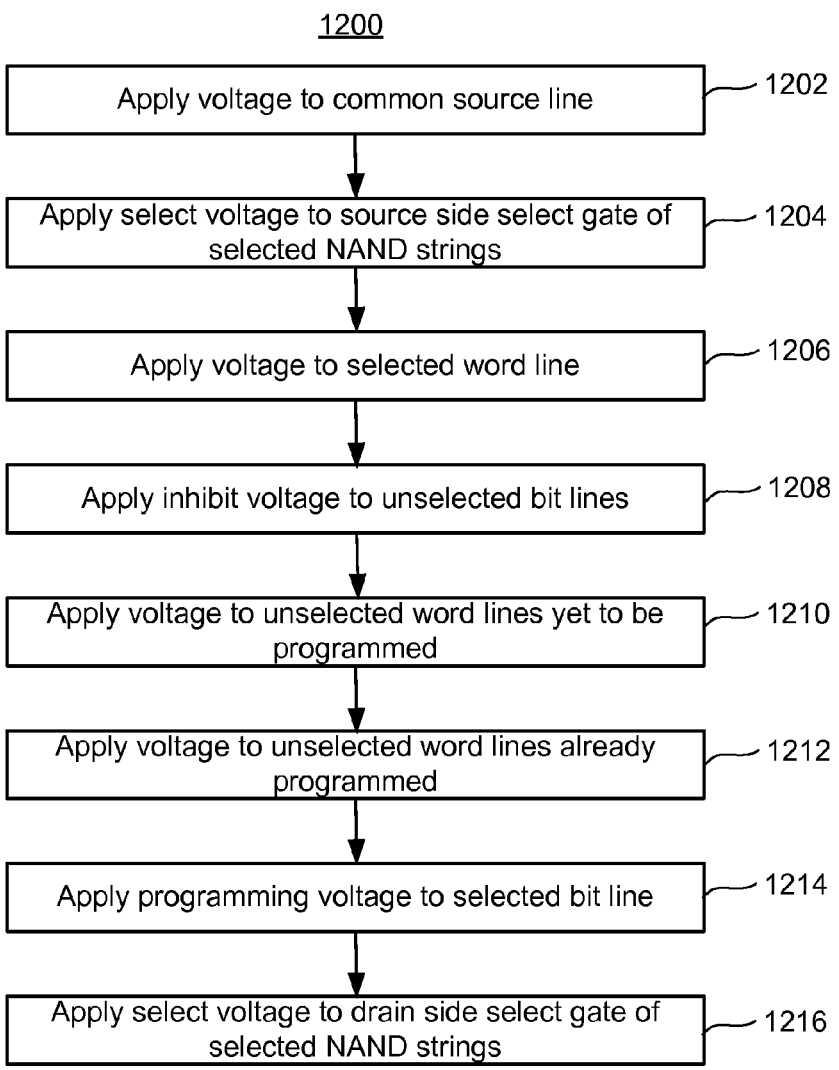
Fig. 12

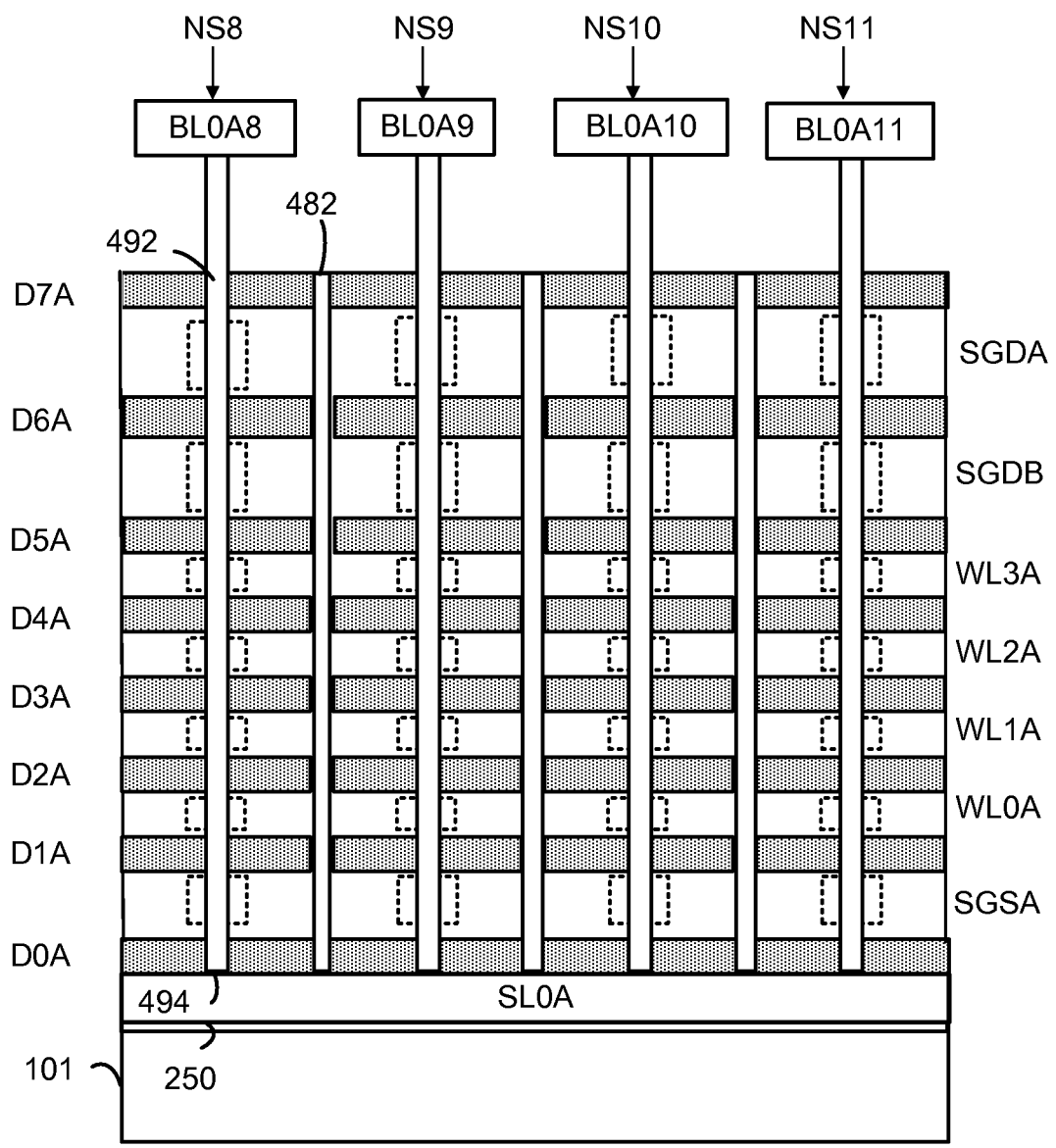

3D STACKED NON-VOLATILE STORAGE PROGRAMMING TO CONDUCTIVE STATE

BACKGROUND

Description of the Related Art

Recently, ultra high density non-volatile storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole may be drilled in the layers to define many memory layers simultaneously. A NAND string may then be formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

One possible technique for inhibiting an unselected NAND string from programming is to boost its channel potential. However, if the channel potential of an unselected NAND strings in a 3D stacked memory structure is boosted to inhibit programming, the boosting voltage could leak. Leakage of the boosting voltage could result in program disturb.

BRIEF DESCRIPTION OF THE DRAWINGS

Like-numbered elements refer to common components in the different figures.

FIG. 5 illustrates example Vt distributions corresponding to data states for the memory cell array when each memory cell stores two bits of data.

FIG. 6 depicts a flowchart of one embodiment of a process for programming memory cells in a 3D stacked memory device.

FIG. 11C depicts a series of program and verify pulses that may be applied to a selected bit line during one embodiment of a programming operation.

FIG. 12 is a flowchart of one embodiment of applying program conditions to NAND strings in a 3D stacked memory device, in accordance with one embodiment.

FIG. 15 depicts a cross-sectional view of a portion of one embodiment of block 480 of FIG. 4A along line 486.

DETAILED DESCRIPTION

Figure 1A:
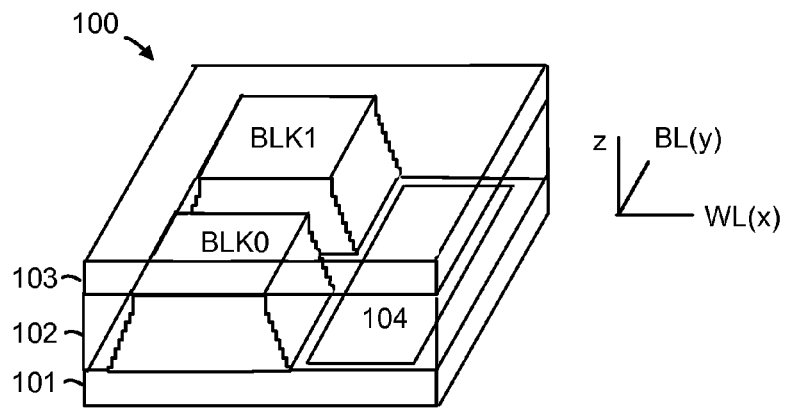
FIG. 1A is a perspective view of a 3D stacked non-volatile memory device.

A 3D stacked non-volatile memory device can be arranged in multiple blocks. In one approach, the memory device includes NAND strings which have a drain-side select gate (SGD) transistor on one end and a source-side select gate (SGS) transistor on the other end.

One possible technique for programming the non-volatile storage elements in a 3D stacked memory device is to apply a program voltage to a gate of a selected non-volatile storage element while a lower voltage is in the channel below the selected non-volatile storage element. One possible technique to inhibit unselected NAND strings from programming is to boost the channel potential. However, the channel potential could leak, which may result in program disturb. NAND strings in some 3D stacked memory devices may be more susceptible to leakage of boosted channel potential than NAND strings in some 2D memory devices. A possible reason for this is that memory cells in a 3D stacked memory device may use a thin film transistor (TFT) structure, in some embodiments. Therefore, some 3D NAND stacked memory devices may be more susceptible to program disturb if their channel potentials are boosted to inhibit them than 2D NAND memory devices.

In one embodiment, programming 3D stacked non-volatile memory devices is achieved without boosting channels of unselected NAND strings to inhibit them from programming. Therefore, program disturb associated with leakage of boosted channel potential may be avoided.

In one embodiment, memory cells in a 3D NAND stacked memory device are erased by increasing their threshold voltages. This places the memory cells in a non-conductive state in one embodiment. By non-conductive state it is meant that memory cells that pass erase verify should not conduct a current. In other words, the erase verify voltage may be below the erase threshold distribution. The channel potential of NAND strings that pass erase verify may be boosted to prevent further erasure.

Programming the non-volatile storage elements in the 3D NAND stacked memory device may be achieved by lowering the Vt to a conductive state. By conductive state it is meant that memory cells that pass program verify should conduct a current. In other words, the program verify voltages may be above the threshold distribution of their respective program states. Note that unselected NAND strings may be inhibited from programming without boosting their channel potentials. Therefore, problems associated with leakage of boosted channel potential, such as program disturb, may be avoided.

In one embodiment, programming includes applying a series of increasing voltages to selected bit lines until the selected memory cell is programmed. Unselected bit lines may be held at about ground, or close to ground. The selected word line may be grounded, or be held close to ground. Unselected word lines between the selected word line and the bit line may receive about the selected bit line voltage. Unselected word lines between the source line and the selected word line may receive about half the selected bit line voltage. The drain side select gate may receive about half the selected bit line voltage. The source side select gate may be held at about ground. The common source line may be at about a few volts. The foregoing are example voltages for one embodiment. Other voltages may be used.

In one embodiment, a NAND string in the 3D NAND stacked memory device has two drain side select transistors in series. The transistor nearest the bit line can have about half the selected bit line voltage applied to it during programming. The other transistor can be held at ground, or close to ground. This combination can help to keep the channels of unselected NAND strings at about 0V during programming. In one embodiment, word lines in unselected blocks have about 0V applied to them. Therefore, program disturb may be avoided.

In the discussion below, FIGS. 1A-4C provide structural details of embodiments of a 3D stacked non-volatile memory device. FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
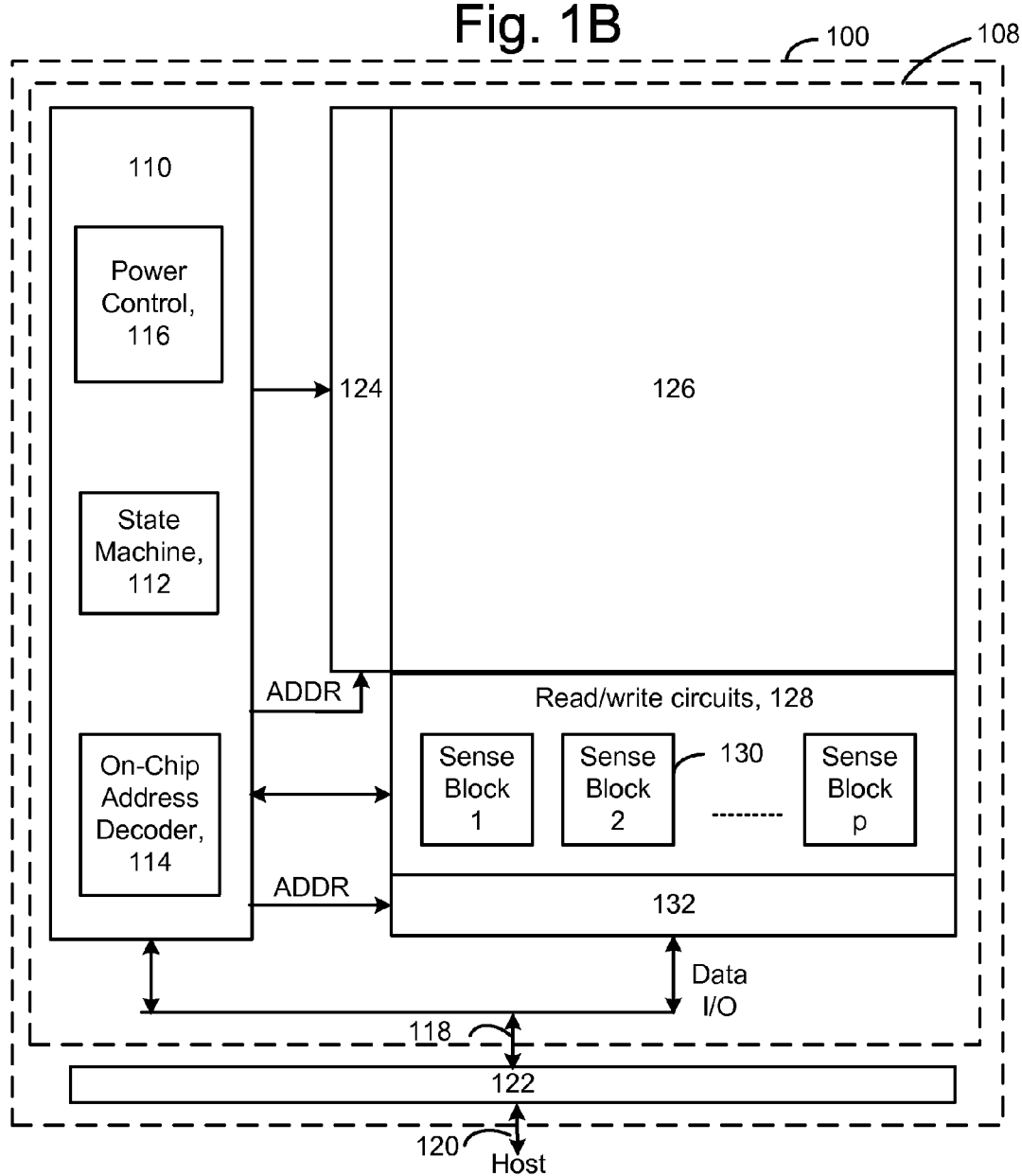
FIG. 1B is a functional block diagram of the 3D stacked non-volatile memory device of FIG. 1A.

FIG. 1B is a functional block diagram of the 3D stacked non-volatile memory device 100 of FIG. 1A. The memory device 100 may include one or more memory die 108. The memory die 108 includes a 3D (three-dimensional) memory array of storage elements 126, e.g., including the blocks BLK0 and BLK1, control circuitry 110, and read/write circuits 128. The memory array 126 is addressable by word lines via a row decoder 124 and by bit lines via a column decoder 132. The read/write circuits 128 include multiple sense blocks 130 (sensing circuitry) and allow a unit (e.g., page) of storage elements to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers and word line layer portions, drain- and source-side select gate drivers (referring, e.g., to drain- and source-sides or ends of a string of memory cells such as a NAND string, for instance) and source lines. The sense blocks 130 can include bit line drivers, in one approach.

In some implementations, some of the components can be combined. In various designs, one or more of the components (alone or in combination), other than memory array 126, can be thought of as at least one control circuit. For example, a control circuit may include any one of, or a combination of, control circuitry 110, state machine 112, decoders 114/132, power control 116, sense blocks 130, read/write circuits 128, and controller 122, and so forth.

The controller 122, the control circuitry 110, the row decoder 124, the column decoder, and the read/write circuits 128 may be referred to herein as one or more managing circuits.

In another embodiment, a non-volatile memory system uses dual row/column decoders and read/write circuits. Access to the memory array 126 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits to bit lines from the top of the array 126. In this way, the density of the read/write modules is reduced by one half.

Other types of non-volatile memory in addition to NAND flash memory can also be used.

Figure 2A:
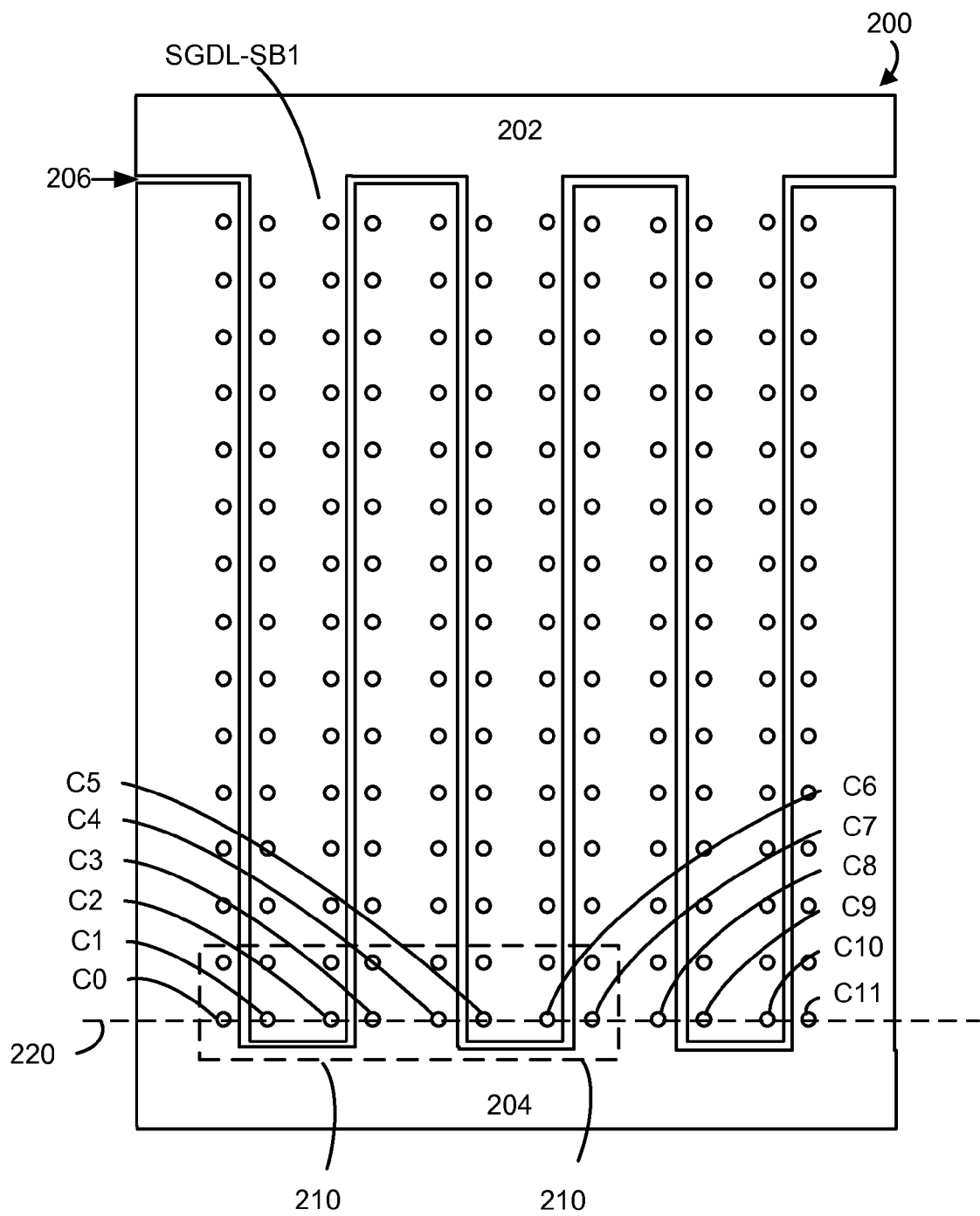
FIG. 2A depicts a top view of a U-shaped NAND embodiment of a block.
Figure 2B:
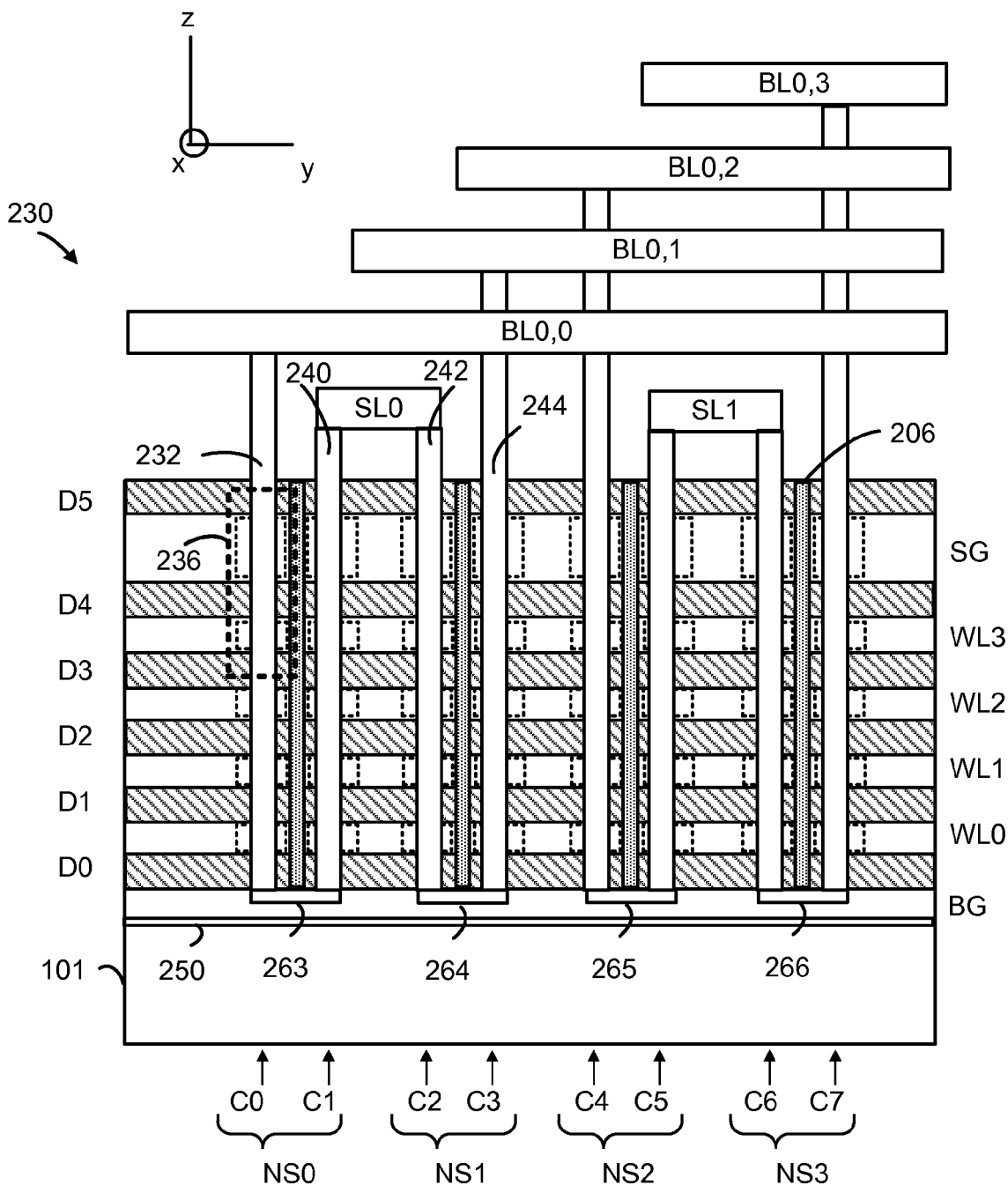
FIG. 2B depicts a cross-sectional view of a portion of one embodiment of the block of FIG. 2A.

FIG. 2A is a top view of a U-shaped NAND embodiment of a block 200, as an example implementation of BLK0 in FIG. 1A. The view is of a representative layer among the multiple word line layers in a stack. FIG. 2B depicts a cross-sectional view of a portion of one embodiment of the block 200 of FIG. 2A, along line 220. Referring to FIG. 2B, the stack includes alternating dielectric and conductive layers. The dielectric layers include D0 to D5 and may be made of SiO2, for instance. The conductive layers include BG, which is a back gate layer, WL0 to WL3, which form word line layers, e.g., conductive paths to control gates of the memory cells at the layer, and SG, which forms a select gate layer, e.g., a conductive path to control gates of select gate transistors of NAND strings. The word line layer of FIG. 2A may represent any one of WL0 to WL3, for instance. The conductive layers may include doped polysilicon or metal silicide, for instance. In one embodiment, the word line layers are doped P+ and the SG layer is doped N+. An example voltage of 5-10 V may be applied to the back gate to maintain a conductive state which connects the drain- and source-side columns.

Referring now to FIG. 2A, for each block 200, the word line layer is divided into two word line layer portions 202 and 204, in one embodiment. Each block includes a slit pattern, in one embodiment. A slit refers, e.g., to a void which extends vertically in the stack, typically from an etch stop layer at the bottom to at least a top layer of the stack. The slit can be filled with insulation to insulate words line layer portions from one another. A slit 206 may be a single continuous slit which extends in a zig-zag pattern in the block so that the block is divided into two portions, 202 and 204, which are insulated from one another. This approach can provide greater flexibility in controlling the memory cells since the word line layer portions can be driven independently.

Each block includes rows of columnar, e.g., vertical, memory holes or pillars, represented by circles in FIG. 2A. Each row represents a vertical group of columns in the figure. The memory holes extend vertically in the stack and include memory cells such as in a vertical NAND string. Example columns of memory cells along a line 220 include C0 to C11. FIG. 2A represents a simplification, as many more rows of memory holes may be used. Also, the figures are not necessarily to scale. The columns of memory cells can be arranged in subsets or sub-blocks.

Word line drivers (not depicted in FIG. 2A) can independently provide signals such as voltage waveforms to the word lines 202 and 204.

The drawings are not to scale and do not show all memory columns. For example, a block might have 12 memory columns in the y direction as shown, but a very large number such as 32 k memory columns in the x direction, for a total of 384 k memory columns in a block. With U-shaped NAND strings, 192 k NAND strings are provided in this example. With straight NAND strings, 384 k NAND strings are provided in this example. Assume there are four memory cells per column, so there are 384 k×4=1,536 k or 1,536,000 total cells in the set.

Further details of FIG. 2B will now be discussed. As noted, FIG. 2B depicts a cross-sectional view of a portion of block 200 of FIG. 2A, along line 220. Columns of memory cells C0 to C7 are depicted in the multi-layer stack. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 266 which connect the columns. The back gate thus connects the two columns of each U-shaped NAND string. For example, NS0 (NS=NAND string) includes columns C0 and C1 and connecting portion 263. NS0 has a drain end 232 and a source end 240. NS1 includes columns C2 and C3 and connecting portion 264. NS1 has a drain end 244 and a source end 242. NS2 includes columns C4 and C5 and connecting portion 265. NS3 includes columns C6 and C7 and connecting portion 266.

The source line SL0 is connected to the source ends 240 and 242 of two adjacent memory strings NS0 and NS1. The source line SL0 is also connected to other sets of memory strings which are behind NS0 and NS1 in the x direction. Recall that additional U-shaped NAND strings in the stack 230 extend behind the U-shaped NAND strings depicted in the cross-section, e.g., along the x-axis, in a SGD line direction.

The slit portion 206 from FIG. 2A is also depicted as an example. In the cross-section, multiple slit portions are seen, where each slit portion is between the drain- and source-side columns of a U-shaped NAND string.

Four bit lines (BL0,0; BL0,1; BL0,2; BL0,3) are depicted in FIG. 2B. Each bit line is in communication with one of the NAND strings depicted in FIG. 2B. For example, bit line BL0,0 is in communication with NAND string NS0, BL0,1 is in communication with NAND string NS1, etc. By in communication with it is meant that there is a drain side select gate in layer SG that can be used to selectively connect the NAND string to its bit line. Each of the bit lines may connect to NAND strings in other blocks (not depicted in FIG. 2B). The other blocks could be similar to the one depicted in FIG. 2B. However, those other blocks are associated with other word lines, in one embodiment. Referring back to FIG. 2A, the word lines in other blocks 200 may be similar to word lines 202 and 204. However, the word lines 202, 204 in other blocks 200 may be driven by other drivers.

Short dashed lines in FIG. 2B depict memory cells and select gate transistors, as discussed further below. A region 236 of the stack is shown in greater detail in FIG. 2C.

Figure 14A:
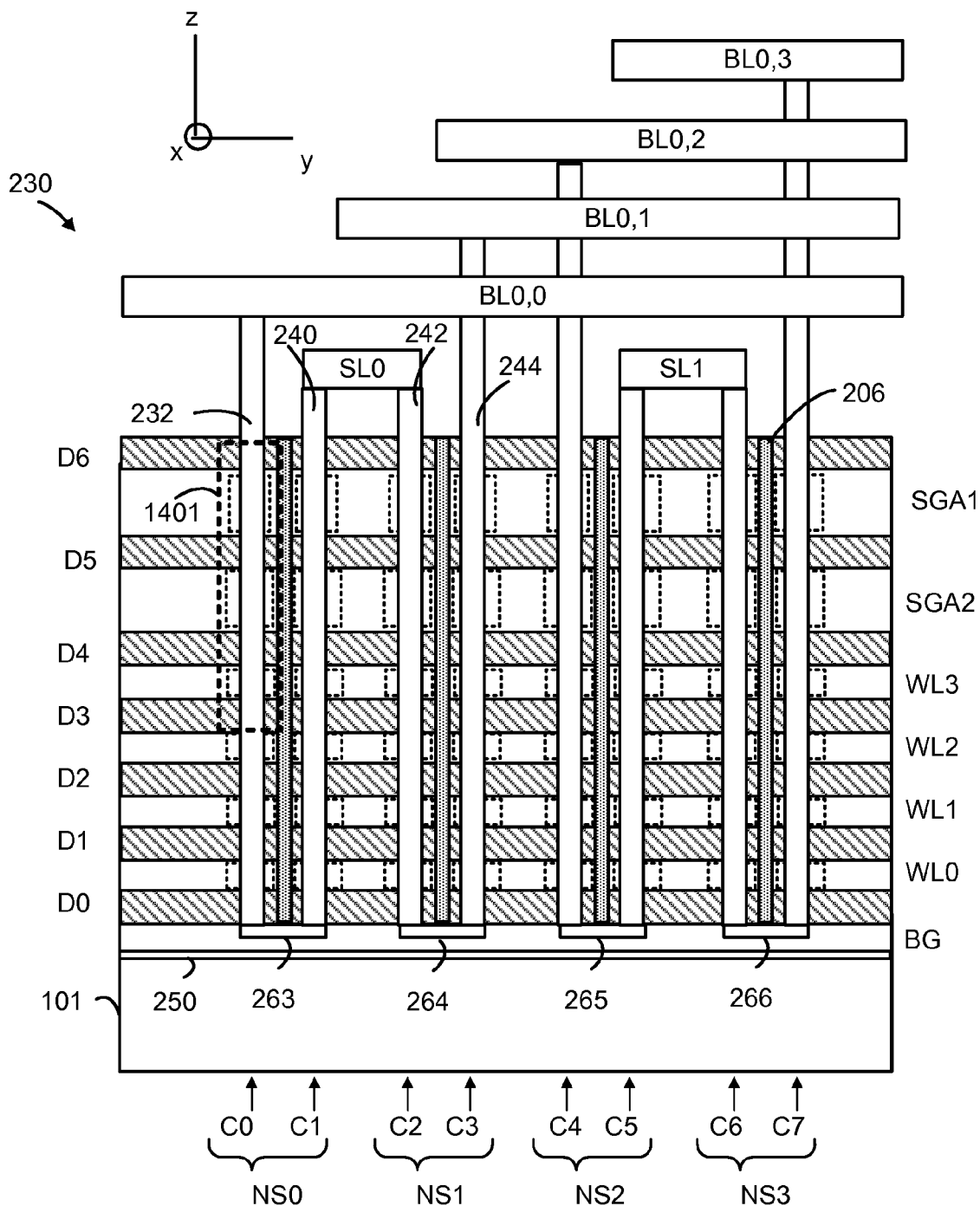
FIG. 14A depicts a cross-sectional view of a portion of one embodiment of the block 200 of FIG. 2A, along line 220.

In the embodiment of FIG. 2B, a NAND string may have a single drain side select gate transistor. In one embodiment, a NAND string may have more than one drain side select gate transistor. For example, FIG. 14A depicts one embodiment in which NAND strings have two drain side select gate transistors in series.

Figure 2C:
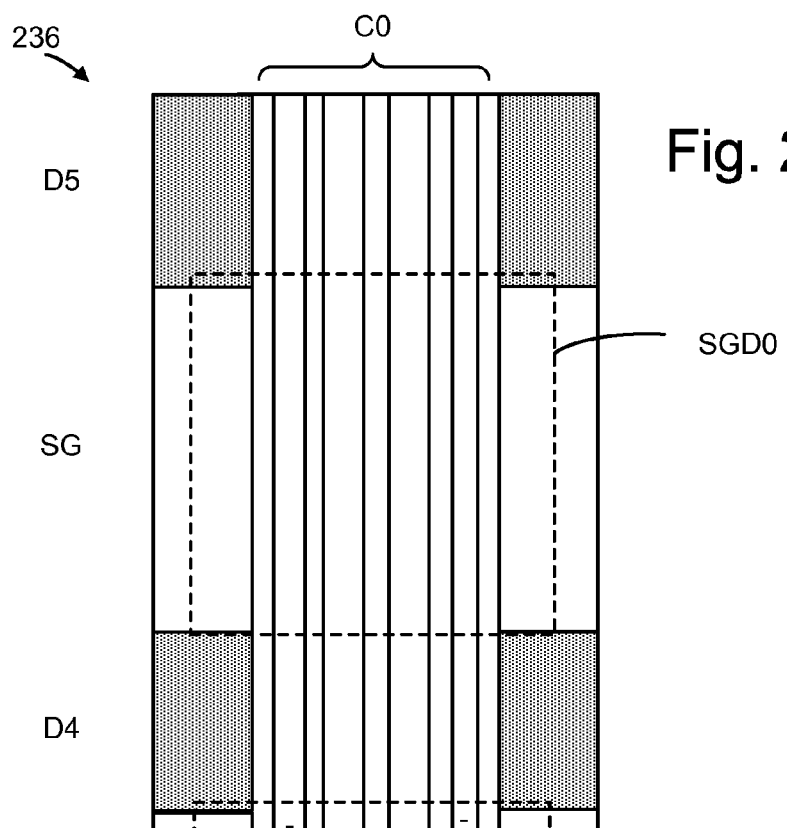
FIG. 2C depicts a close-up view of the region 236 of the column C0 of FIG. 2B.
Figure 2D:
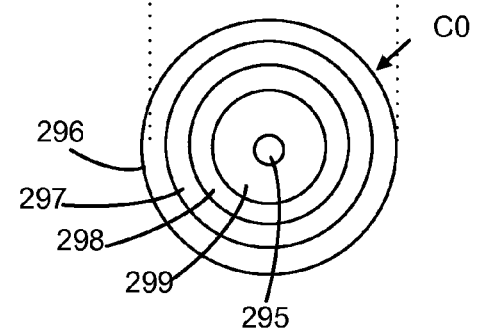
FIG. 2D depicts a cross-sectional view of the column C0 of FIG. 2B.

FIG. 2C depicts a close-up view of the region 236 of the column C0 of FIG. 2B, showing a drain-side select gate transistor SGD0 and a memory cell MC3,0. FIG. 2D depicts a cross-sectional view of the column C0 of FIG. 2C. Each layer is ring-shaped in one possible approach, except the core filler, which may be cylindrical.

Referring now to FIG. 2C, the region shows portions of the dielectric layers D3 to D5 and the conductive layers WL3 and SG. Each column includes a number of layers which may be deposited along the sidewalls of the column. These layers can include oxide-nitride-oxide and polysilicon layers which are deposited, e.g., using atomic layer deposition. For example, a block oxide can be deposited as layer 296, a nitride such as SiN as a charge trapping layer can be deposited as layer 297, a tunnel oxide can be deposited as layer 298, a polysilicon body or channel can be deposited as layer 299, and a core filler dielectric can be deposited as region 295. Additional memory cells are similarly formed throughout the columns.

When a memory cell is erased, electrons may be stored in a portion of the charge trapping layer which is associated with the memory cell, in accordance with one embodiment. For example, electrons are represented by "−" symbols in the charge trapping layer 297 for MC3,0. These electrons are drawn into the charge trapping layer from the polysilicon body, and through the tunnel oxide. The threshold voltage of a memory cell is increased in proportion to the amount of stored charge. Note that this may raise the threshold voltage (Vt) of the memory cell. Also note that this may contrast with other techniques for erasing a 3D stacked memory cell that may erase a memory cell by removing electrons from the charge trapping layer 297, thereby lowering the Vt.

During a program operation, the channel may be brought to a relatively high voltage, while the word line is held at a lower voltage, such as ground. The difference in voltage may remove electrons from the charge trapping layer 297. Removing the electrons may lower the Vt.

In one embodiment, inhibiting programming of unselected NAND strings is achieved by establishing a low voltage in the channel. For example, a low voltage such as ground or a few volts may be placed on unselected bit lines, and passed to the channel by the drain side select gate. Note that boosting of the NAND string channel is not needed to inhibit programming of these unselected NAND strings. In contrast, some techniques may employ channel boosting to inhibit programming of unselected NAND strings. However, if the boosting voltage leaks then program disturb may occur. However, since channel boosting is not used in one embodiment of programming, there is no boosted voltage to leak.

In one embodiment, the word line layers are doped P+ and the SG layer is doped P+. The polysilicon body or channel layer 299 may be P−. However, between the SG layer and the bit line, the channel layer 299 may be N+.

Note that the charge trapping layer 297 is not required in the SG layer. In this case, layer 298 could be made thicker in place of charge trapping layer 297. This is further discussed with respect to FIG. 14A.

Figure 3A:
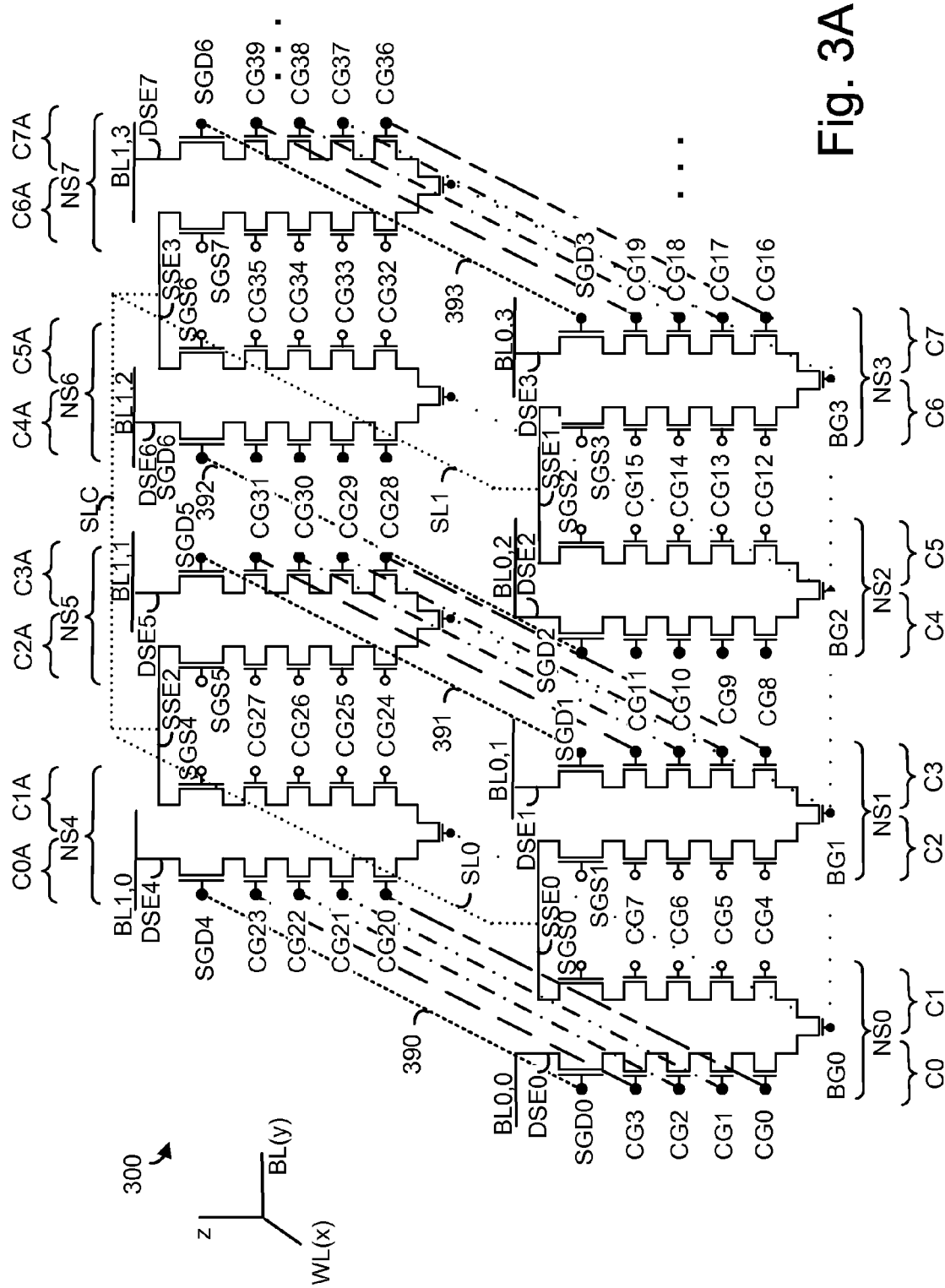
FIG. 3A depicts one embodiment of a circuit showing electrical connections between drain-sides of U-shaped NAND strings, consistent with the portion 210 of the block of FIG. 2A.
Figure 3B:
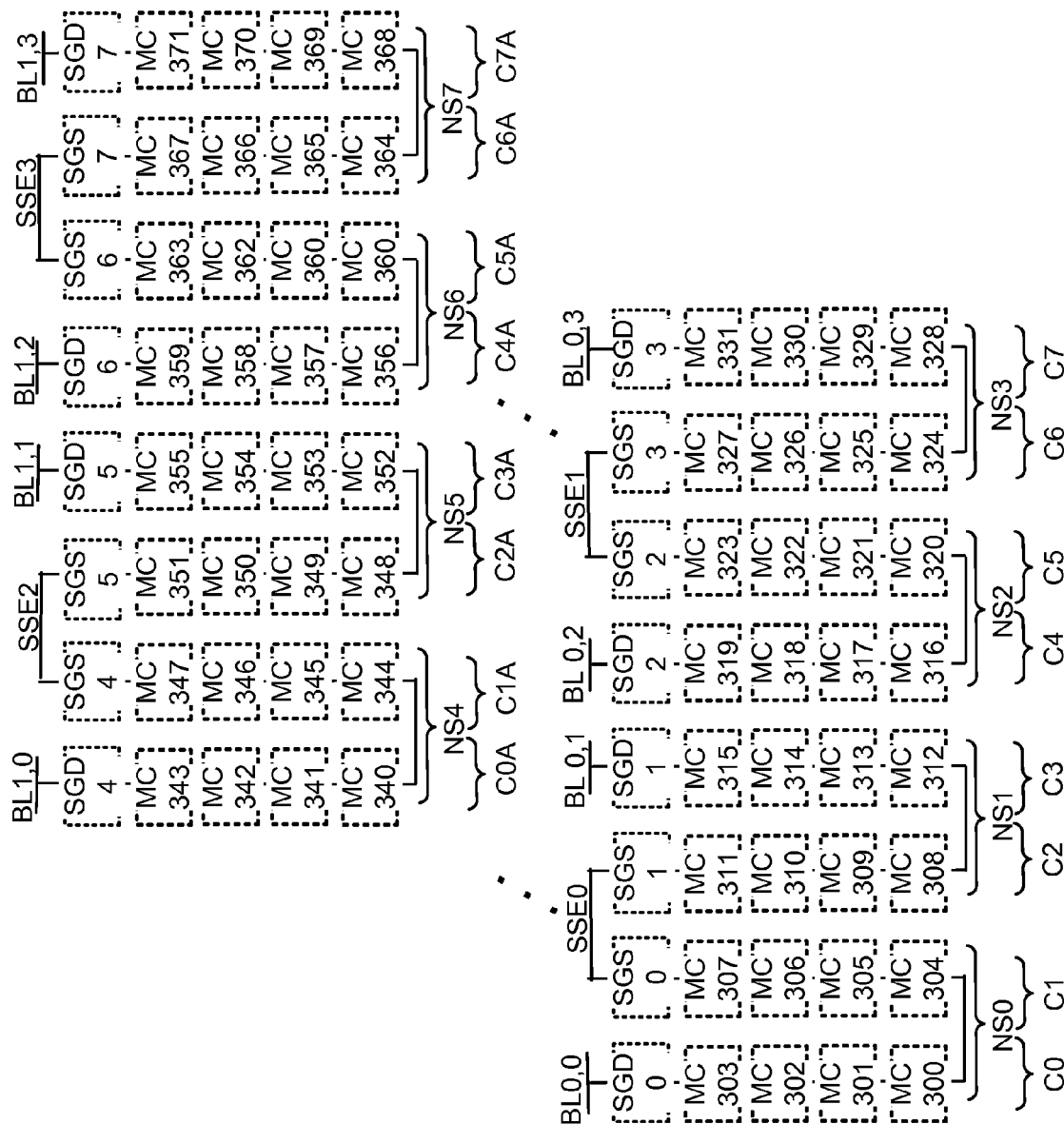
FIG. 3B depicts an example arrangement of memory cells consistent with the circuit of U-shaped NAND strings of FIG. 3A.

FIG. 3A depicts one embodiment of a circuit showing electrical connections between drain-sides of U-shaped NAND strings, consistent with the portion 210 of the block of FIG. 2A. FIG. 3B shows an example arrangement of memory cells consistent with the circuit of U-shaped NAND strings of FIG. 3A.

There are eight NAND strings and eight bit lines depicted in FIG. 3A and FIG. 3B. Each NAND string is in communication with one of the bit lines. For example, NAND string NS0 is in communication with bit line BL0,0.

Each NAND string has a drain-side column with four memory cells and an SGD transistor, and a source-side column with four memory cells and an SGS transistor. For example, on the drain-side, NS0 has CG0-CG3 and SGD0, NS1 has CG8-CG11 and SGD1, NS2 has CG8-CG11 and SGD2, NS3 has CG16-CG19 and SGD3, NS4 has CG20-CG23 and SGD4, NS5 has CG28-CG31 and SGD5, NS6 has CG28-CG31 and SGD6, and NS7 has CG36-CG39 and SGD7. On the source-side, NS0 has CG4-CG7 and SGS0, NS1 has CG4-CG7 and SGS1, NS2 has CG12-CG15 and SGS2, NS3 has CG12-CG15 and SGS3, NS4 has CG24-CG27 and SGS4, NS5 has CG24-CG27 and SGS5, NS6 has CG32-CG35 and SGS6, and NS7 has CG32-CG35 and SGS7. The drain-side columns are C0, C3, C4, C7, C0A, C3A, C4A and C7A for NS0-NS7, respectively. The source-side columns are C1, C2, C5, C6, C1A, C2A, C5A and C6A for NS0-NS7, respectively.

Further, each NAND string has a source-side end (SSE0 shared by NS0 and NS1, SSE1 shared by NS2 and NS3, SSE2 shared by NS4 and NS5, and SSE3 shared by NS6 and NS7) and a drain side end (DSE0 of NS0, DSE1 of NS1, DSE2 of NS2, DSE3 of NS3, DSE4 of NS4, DSE5 of NS5, DSE6 of NS6, and DSE7 of NS7). Each NAND string has a back gate (BG0 for NS0, BG1 for NS1, BG2 for NS2, and BG3 for NS3). The back gates may be connected to one another. A source line SL0 connects SSE0 and SSE2, and a source line SL1 connects SSE1 and SSE3. Optionally, a source line connector (SLC) connects SL0 and SL1. Typically, for one-sided erase, the source lines are tied together and the SLC is used. For, two-sided erase, the source lines are not tied together and the SLC is not used.

Control gates (CG) of the drain-side memory cells are connected to one another by word line layers. For example, CG0-CG3 are connected to CG20-CG23, respectively, CG8-CG11 are connected to CG28-CG31, respectively, and CG16-CG19 are connected to CG36-CG39, respectively. Control gates (CG) of the source-side memory cells are also connected to one another by word line layers. For example, CG4-CG7 are connected to CG24-CG27, respectively, and CG12-CG15 are connected to CG32-CG35, respectively.

Additionally, the drain-side control gates of memory cells at a given level of the stacked 3D memory device are connected to one another. For example, CG0, CG8, CG16, CG20, CG28 and CG36 are connected to one another at the first word line level (WL0). CG1, CG9, CG17, CG21, CG29 and CG37 are connected to one another at the second word line level (WL1). CG2, CG10, CG18, CG22, CG30 and CG38 are connected to one another at the third word line level (WL2). CG3, CG11, CG19, CG23, CG31 and CG39 are connected to one another at the fourth word line level (WL3).

Additionally, the source-side control gates of memory cells at a given level of the stacked 3D memory device are connected to one another. For example, CG4, CG12, CG24 and CG32 are connected to one another at the first word line level (WL0). CG5, CG13, CG25 and CG33 are connected to one another at the second word line level (WL1). CG6, CG14, CG26 and CG34 are connected to one another at the third word line level (WL2). CG7, CG15, CG27 and CG35 are connected to one another at the fourth word line level (WL3) (consistent with FIG. 3F).

The control gates are associated with memory cells as can be seen by referring also to FIG. 3B. Specifically, CG0-CG3 are associated with MC300-MC303, respectively. CG4-CG7 are associated with MC304-MC307, respectively, and MC308-MC311, respectively. CG8-CG11 are associated with MC312-MC315, respectively, and MC316-MC319, respectively. CG12-CG15 are associated with MC320-MC323, respectively, and MS324-MC327, respectively. CG16-CG19 are associated with MC328-MC321, respectively. Furthermore, CG20-CG23 are associated with MC340-MC343, respectively. CG24-CG27 are associated with MC344-MC347, respectively, and MC348-MC351, respectively. CG28-CG31 are associated with MC352-MC355, respectively, and MS356-MC359, respectively. CG32-CG35 are associated with MC360-MC363, respectively, and MC364-MC367, respectively. CG36-CG39 are associated with MC368-MC371, respectively.

The dark circles in FIG. 3A indicate drain-side control gates of memory cells and SGD transistors. As noted above, in one embodiment, each NAND string has two SGD transistors in series.

Figure 4A:
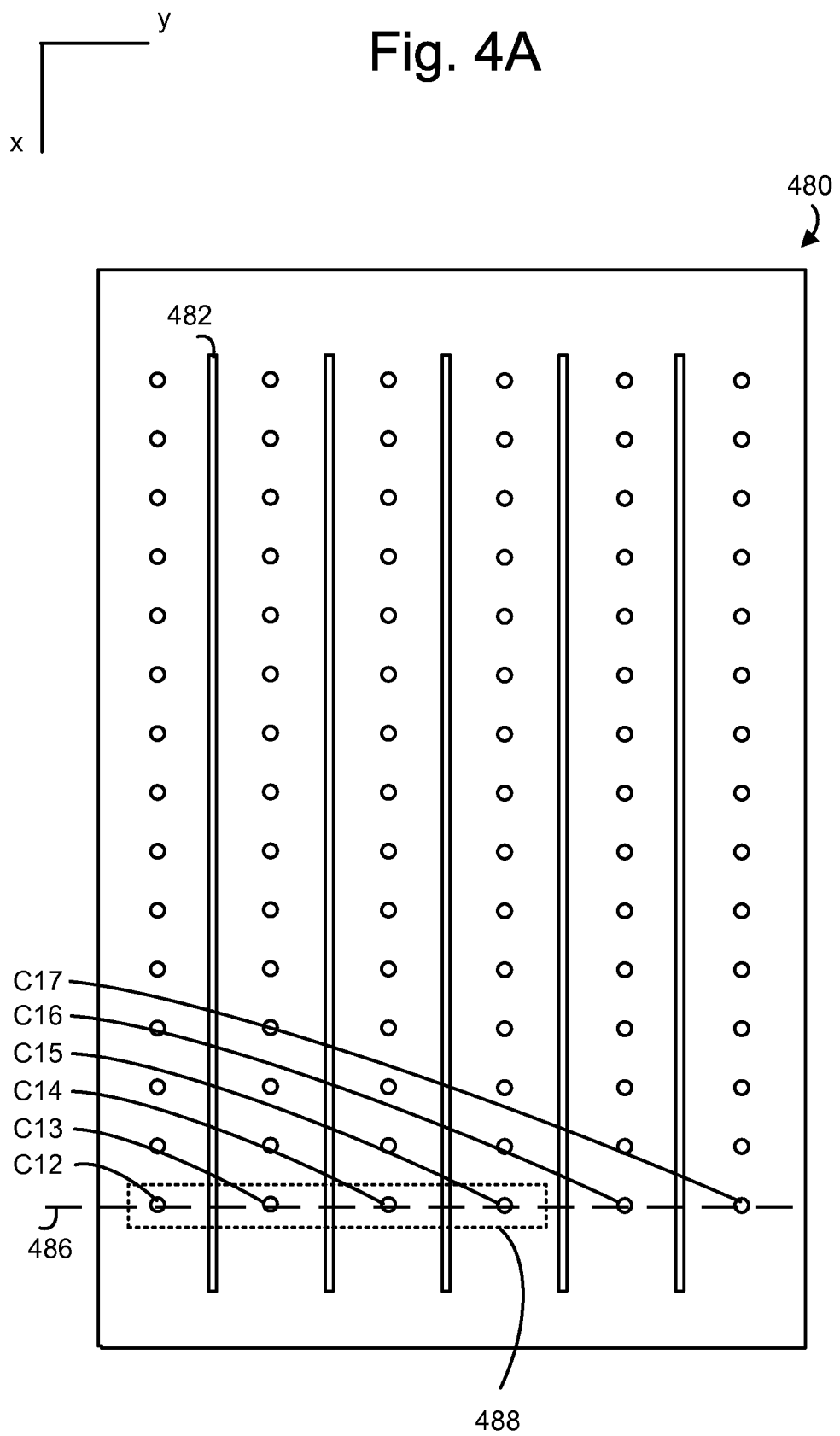
FIG. 4A depicts a top view of a straight NAND string embodiment of the block BLK0 of FIG. 1A.

FIG. 4A depicts a top view of a straight NAND string embodiment 480 of the block BLK0 of FIG. 1A. In this configuration, a NAND string has only one column, and the source-side select gate is on the bottom of the column instead of on the top, as in a U-shaped NAND string. Moreover, a given level of a block has one word line layer which is connected to each of the memory cells of the layer. A number of slits, such as example slit 482, can also be used. These insulation-filled slits are used in the fabrication process to provide structural support for the stack when undoped polysilicon layers are removed by a wet etch and a dielectric is deposited to form the alternating dielectric layers. A dashed line 486 extends through columns C12 to C17. A cross-sectional view along line 486 of portion 488 is shown in FIG. 4B.

Figure 4B:
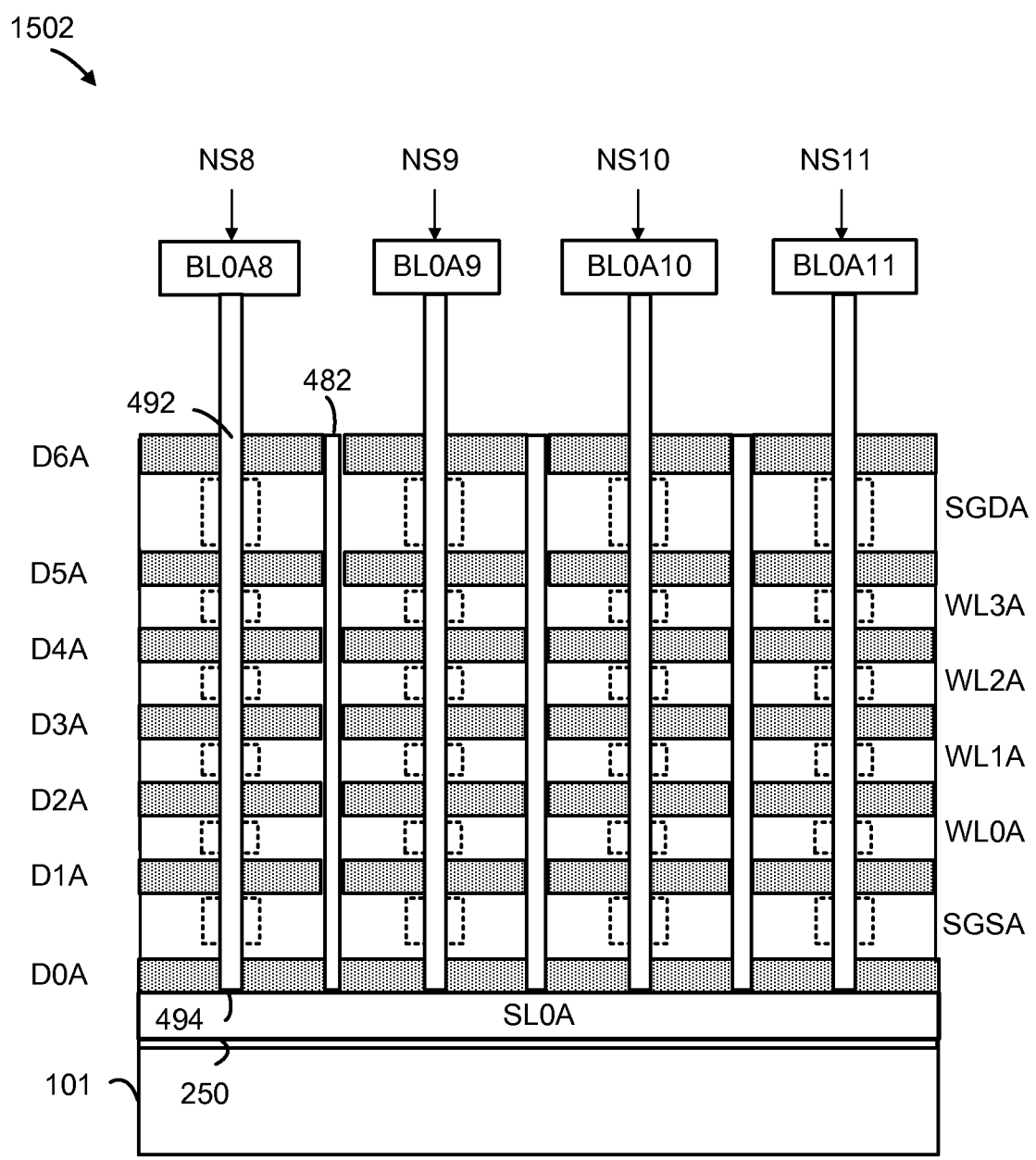
FIG. 4B depicts a cross-sectional view of the portion 488 of the block 480 of FIG. 4A along line 486.

FIG. 4B depicts a cross-sectional view of the portion 488 of the block 480 of FIG. 4A along line 486. Columns of memory cells corresponding to NAND strings NS8 to NS11 are depicted in the multi-layer stack. The stack 490 includes a substrate 101, an insulating film 250 on the substrate, and a portion of a source line SL0A. Recall that the additional straight NAND strings in a SGD line subset extend in front of and in back of the NAND strings depicted in the cross-section, e.g., along the x-axis. NS8 has a source end 494 and a drain end 492. The slit 482 from FIG. 4A is also depicted with other slits. A portion of the bit lines BL0A8-BL0A11 are also depicted. Dashed lines depict memory cells and select gate transistors. In the embodiment of FIG. 4B, a NAND string has a single drain side select transistor. In one embodiment, a straight NAND string has two drain side select transistors.

Figure 4C:
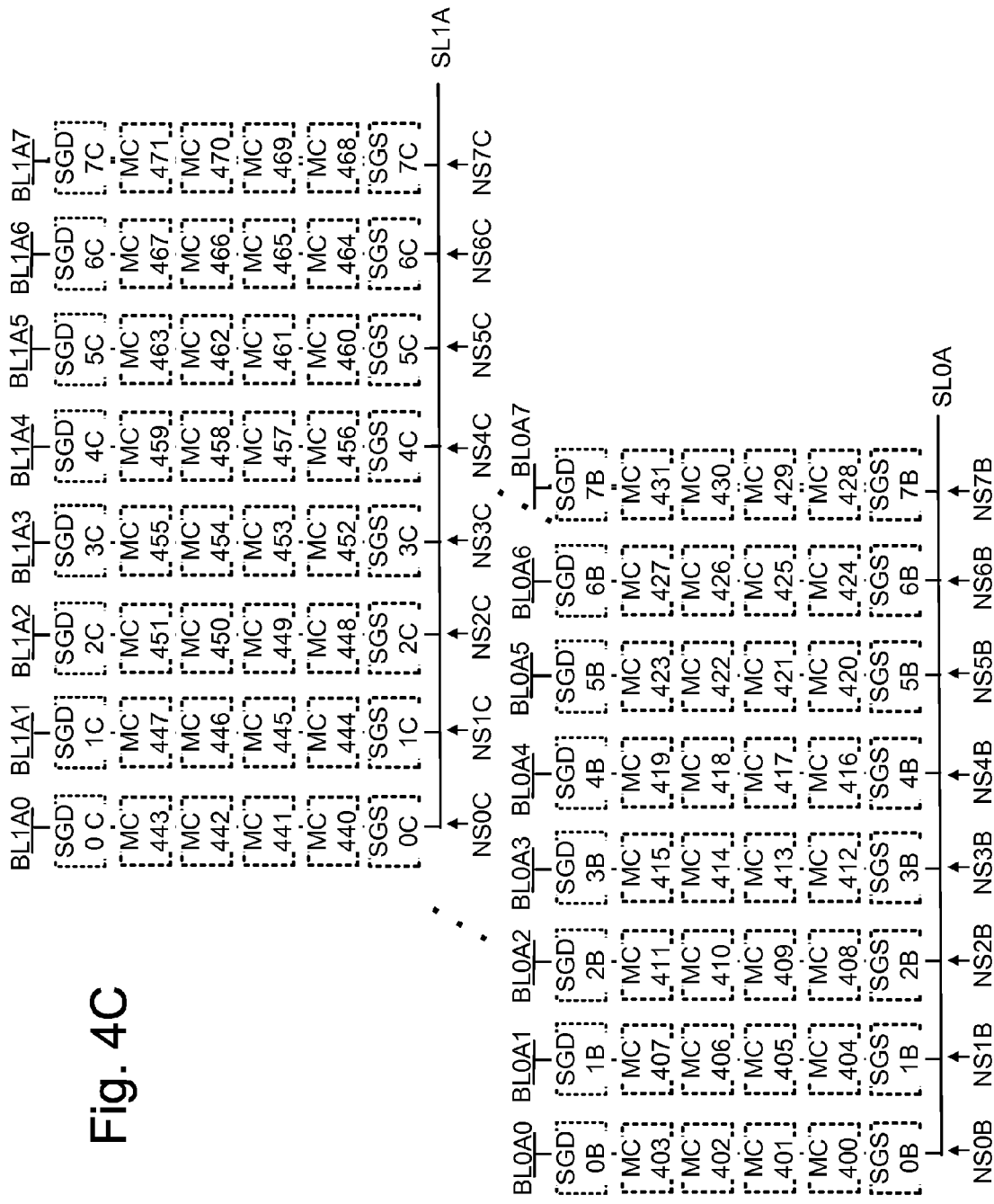
FIG. 4C depicts an example arrangement of memory cells consistent with the circuit of straight NAND strings of FIG. 4A.

FIG. 4C depicts an example arrangement of memory cells consistent with the circuit of straight NAND strings of FIG. 4A. Eight examples bit lines BL0A0-BL0A7 are in communication with NAND strings NS0B-NS7B, respectively. Eight examples bit lines BL1A0-BL1A7 are in communication with NAND strings NS0C-NS7C, respectively.

Each NAND string includes a SGD transistor between its memory cells and the bit line, and a SGS transistor between its memory cells and the source line. The SGD and SGS transistors for the NAND strings are: NS0B (SGD0C and SGS0C), NS1B (SGD1C and SGS1C), NS2B (SGD2C and SGS2C), NS3B (SGD3C and SGS3C), NS4B (SGD4C and SGS4C), NS5B (SGD5C and SGS5C), NS6B (SGD6C and SGS6C), NS7B (SGD7C and SGS7C), NS0C (SGD0C and SGS0C), NS1C (SGD1C and SGS1C), NS2C (SGD2C and SGS2C), NS3C (SGD3C and SGS3C), NS4C (SGD4C and SGS4C), NS5C (SGD5C and SGS5C), NS6C (SGD6C and SGS6C), and NS7C (SGD7C and SGS7C).

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example Vt distributions corresponding to data states for the memory cell array when each memory cell stores two bits of data. Other embodiments, however, may store more or fewer than two bits of data per memory cell. FIG. 5 shows four Vt distributions 502, 504, 506, 508 corresponding to an Erase state (Er) and programmed states A, B, and C. In the depicted embodiment, the threshold voltages in the Erase state are higher than all of the programmed states.

Between each of the data states are read reference voltages used for reading data from memory cells. For example, FIG. 5 shows read reference voltage VrA between the erase state and the A-state, VrB between the A-state and B-state, and VrC between the B-state and C-state. By testing whether the threshold voltage of a given memory cell is above or below the respective read reference voltages, the system can determine what state the memory cell is in.

At or near the upper edge of each programmed state are verify reference voltages. For example, FIG. 5 shows VvA for the A-state, VvB for the B-state, and VvC for the C-state. When programming memory cells to a given state, the system will test whether those memory cells have a threshold voltage less than or equal to the verify reference voltage.

FIG. 6 depicts a flowchart of one embodiment of a process 600 for programming memory cells in a 3D stacked memory device. In one embodiment, the 3D stacked non-volatile storage comprises word lines formed from conductive material that is oriented horizontally. The word lines alternate with dielectric material in a stack. The 3D stacked memory device includes NAND strings that are oriented vertically. The terms "horizontal" and "vertical" are relative terms. In one embodiment, the word lines are horizontal with respect to a substrate and the NAND strings are vertical with respect to a substrate.

In step 602, memory cells in a 3D stacked memory device are erased to a distribution above zero volts. For example, memory cells can be erased to the Erased state 508 depicted in FIG. 5. In one embodiment, electrons are added to a charge storage layer 297 to erase the memory cells. In one embodiment, the channels of NAND strings being erased are established at about ground. An erase voltage may be applied to control gates to cause electrons in the channel to tunnel to the charge storage layer 297, in one embodiment. The channels could be established at a voltage other than ground, such as a few volts. In one embodiment, step 602 erases a block of memory cells. However, another unit could be erased.

In step 604, selected memory cells in a stacked 3D memory device are programmed by reducing their threshold voltages to a target level. For example, memory cells can be programmed to one of the programmed states A, B, or C depicted in FIG. 5. Step 604 may include establishing a programming voltage in channels associated with selected NAND strings. In one embodiment, the programming voltage is established by applying it to a selected bit line and turning on a drain side select gate. The programming voltage may be passed to a channel underneath a selected memory cell. The control gate of the selected memory cell may be held at about ground, or a few volts to remove electrons from the charge storage layer 297, in one embodiment.

In one embodiment, programming progresses along the NAND string from the source line to the bit line. For example, if NS0 in FIG. 3B were being programmed, the order could be MC 307, MC 306, MC 305, MC 304, MC 300, MC 301, MC 302, MC 303.

Figure 7A:
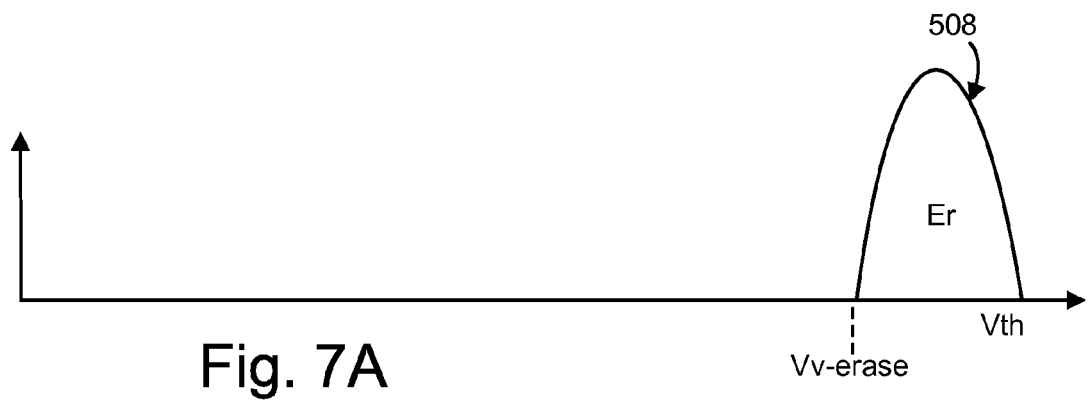
FIGS. 7A-7C depict a two pass programming sequence in accordance with one embodiment.
Figure 7B:
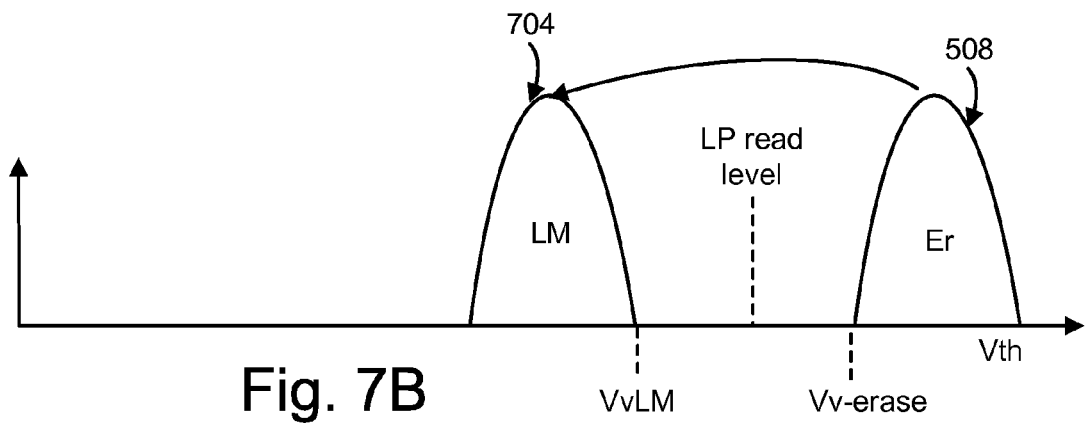
Figure 7C:
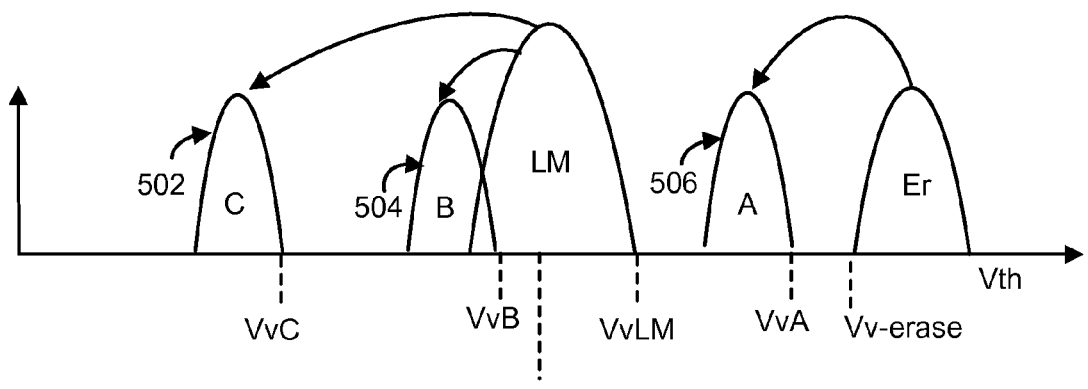

Numerous types of programming sequences can be used for embodiments. The following are a few possible programming sequences that could be used for process 600, or other embodiments disclosed herein. FIGS. 7A-7C depict a two pass programming sequence in accordance with one embodiment. In the first programming pass, a lower page is programmed. In the second pass the upper page is programmed. FIG. 7A depicts an erase distribution 508. In step 602, memory cells can be verified to have a Vt of at least Vv-erase. As depicted in FIG. 7B, in the first program pass storage elements intended for either the B- or C-states are programmed to an intermediate (LM) state 704. The intermediate state 704 has a verify level of VvLM. Memory cells that have a Vt at or below VvLM pass verify in one embodiment.

As depicted in FIG. 7C, in the second pass programming to the A-, B-, and C-states is completed. Storage elements targeted for the A-state are programmed from the Er-state 508 to the A-state 506. Storage elements targeted for the B-state are programmed from the LM-state 704 to the B-state 504. Storage elements targeted for the C-state are programmed from the LM-state 704 to the C-state 502.

Figure 8A:
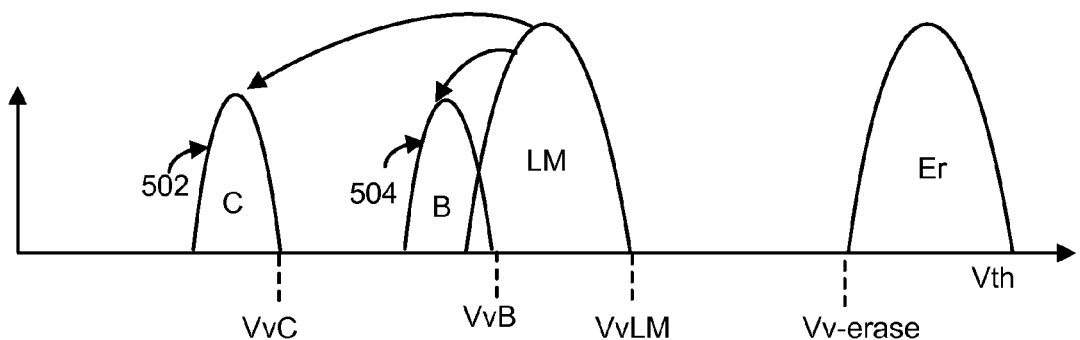
FIGS. 8A and 8B depict one embodiment of the second and third passes of a three pass programming sequence.
Figure 8B:
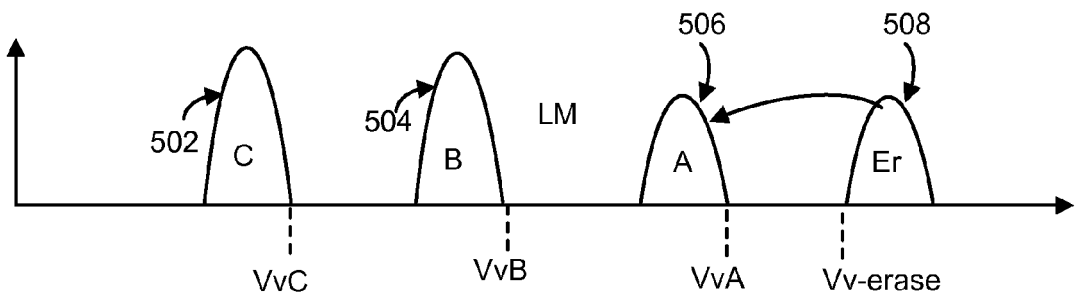

FIGS. 8A and 8B depict one embodiment of the second and third passes of a three pass programming sequence. The first pass may program memory cells to the intermediate state 704, as depicted in FIG. 7B. Thus, in the first pass storage elements intended for either the B- or C-states are programmed to an intermediate state 704.

FIG. 8A depicts the second programming pass in which the B- and C-states are programmed. Storage elements targeted for the B-state are programmed from the LM-state 704 to the B-state 504. Storage elements targeted for the C-state are programmed from the LM-state 704 to the C-state 502. However, note that the A-state is not programmed during the second programming pass.

FIG. 8B depicts a third programming pass in which the A-state is programmed. Storage elements targeted for the A-state are programmed from the Er-state 508 to the A-state 506. Thus, note that the A-state programming is not started until the B- and C-states are complete.

Many other programming sequences might be used. For example, in another three pass programming sequence the C-state may be programmed prior to starting the other states. The first pass could program the lower page, as depicted in FIG. 7B. Thus, in the first pass storage elements intended for either the B- or C-states are programmed to an intermediate state 704. Storage elements targeted for the C-state may programmed from the intermediate state 704 to the C-state 502 in the second pass. Both the A- and B-states may be programmed in the third pass. Storage elements targeted for the A-state may be programmed from the Er-state 508 to the A-state 506. Storage elements targeted for the B-state may be programmed from the intermediate state 704 to the B-state 504.

In one embodiment, known as full sequence programming, storage elements can be programmed from the Er-state 508 directly to any of the programmed states A, B or C. For example, a population of storage elements to be programmed may first be erased so that all storage elements in the population are in the Er-state 508. A series of program pulses may then be used to program storage elements directly into states A, B or C. While some storage elements are being programmed from the Er-state 508 to the A-state 506, other storage elements are being programmed from the Er-state 508 to the B-state 504 and/or from the Er-state 508 to the C-state 502.

Although the programming examples depict four data states and two pages of data, the concepts taught herein can be applied to other implementations with more or fewer than four states and more or fewer than two pages. For example, memory devices with eight, sixteen or more states per storage element may be used.

Figure 9:
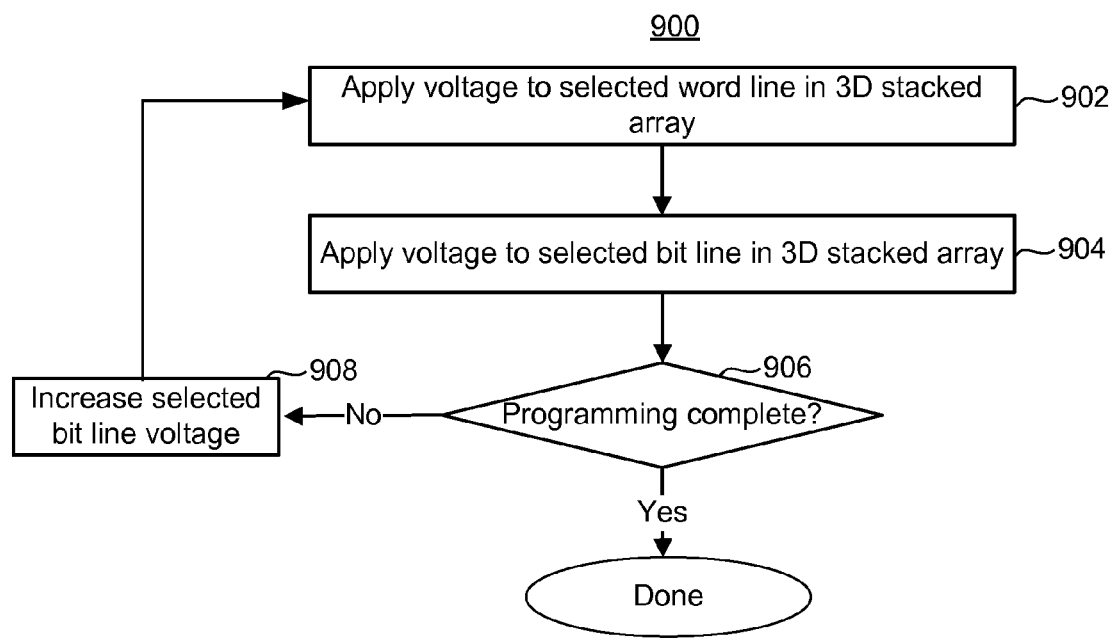
FIG. 9 is a flowchart of one embodiment of a process of programming storage elements in a 3D stacked memory device.

FIG. 9 is a flowchart of one embodiment of a process 900 of programming storage elements in a 3D stacked memory device. The process may be used in step 604 of process 600. The process 900, however, is not limited to process 600. Prior to process 900 the memory cells may be erased to a threshold distribution such as the example erase distribution 508.

In step 902, a voltage is applied to a selected word line in a 3D stacked memory device. As one example, the voltage is about 0V.

In step 904, a programming voltage is applied to a selected bit line in the 3D stacked memory device. As one example, the voltage may be between about 10V-20V. However, the voltage could be less than 10V or greater than 20V. The programming voltage may be applied to the selected bit line while the voltage is applied to the selected word line. In one embodiment, electrons are removed from charge storage layer 297 as a result. This may lower the Vt of the memory cell being programmed.

In step 906, a determination is made whether programming is finished. This step may be performed separately for each memory cell being programmed. If there are still memory cells to be programmed, then the bit line voltage may be increased in step 908. Increasing the bit line voltage is optional. The voltage applied to the selected word line may the same as before.

Then, the process 900 may return to step 902. The process 900 may continue until all, or most of the memory cells have reached their target Vt. In one embodiment, not all of the memory cells need to reach their target Vt, as error correction may be able to correct for such memory cells.

Figure 10:
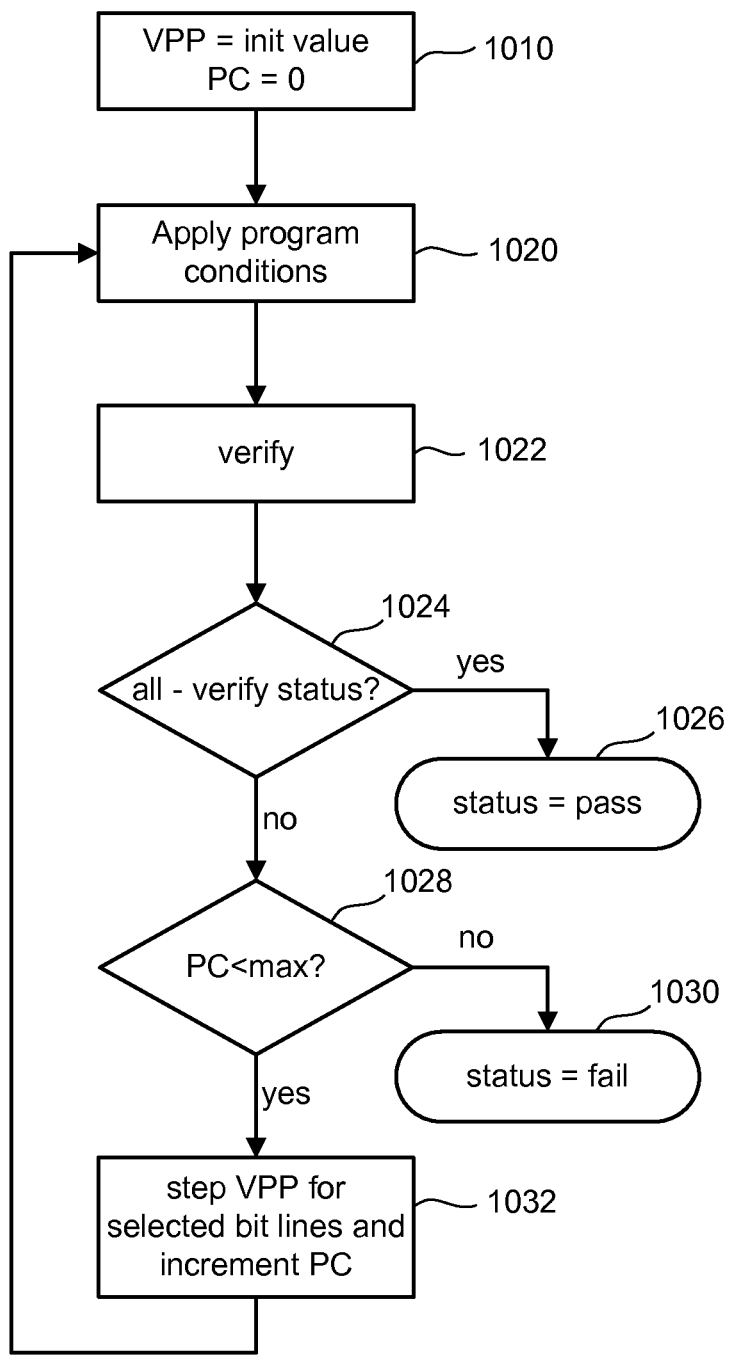
FIG. 10 is a flowchart describing one embodiment of a programming process, which includes one or more verification steps.

FIG. 10 is a flowchart describing one embodiment of a programming process 1000, which includes one or more verification steps. In step 1010, the program voltage (VPP) is set to an initial value. Note that in some embodiments, the program voltage is applied to selected bit lines. Also, in step 1010, a program counter (PC) is initialized to zero. In step 1020, program conditions are applied. These program conditions may include, but are not limited to, the voltage applied to the selected word line and the program voltage applied to the selected bit line. Thus, performing steps 902 and 904 of process 900 is one embodiment of step 1020. Other program conditions such as voltages to unselected bit lines, unselected word lines, and select gates may be applied in step 1020. Further details are discussed below.

In step 1022, a verification process is performed. Referring to FIG. 5, memory cells may be verified for whether their Vt is less than (or equal to) VvA, VvB, or VvC, as appropriate. In one embodiment, memory cells are verified for the intermediate (LM) state 704 verify level of VvLM (see FIG. 7B). Note that when a particular memory cell has been verified as being programmed to its intended state, it may be locked out from further programming. The memory cell can be inhibited from further programming without boosting of the NAND string channel, in one embodiment. This may prevent or reduce program disturb, as problems associated with leakage of a boosted channel potential may be avoided.

In step 1024, it is determined whether memory cells have verified that their threshold voltages are at the final target voltage for that memory cell. Note that it is not required that every memory cell for a given state is verified to be at the appropriate threshold voltage. Error correction is able to correct for some memory cells being above their target threshold voltage. Error correction is able to correct for some memory cells being over-programmed to a Vt that is lower than the target Vt distribution. Step 1024 is referring to all states having completed programming.

If verification passes, the programming process is completed successfully (status=pass) in step 1026. If all of the memory cells are not all verified, then it is determined whether the program counter (PC) is less than a maximum value such as 20. If the program counter (PC) is not less than max (step 1028), then the program process has failed (step 1030). If the program counter (PC) is less than a maximum value (e.g., 20), then the program counter (PC) is incremented by 1 and the program voltage is stepped up to the next pulse in step 1032. The program voltage (VPP) being referred to here is the one applied to selected bit lines. Note that the voltage applied to the selected word line may remain the same throughout one embodiment of process 1000. Subsequent to step 1032, the process loops back to step 1020 and the next set of program conditions are applied to the memory cells.

Figure 11A:
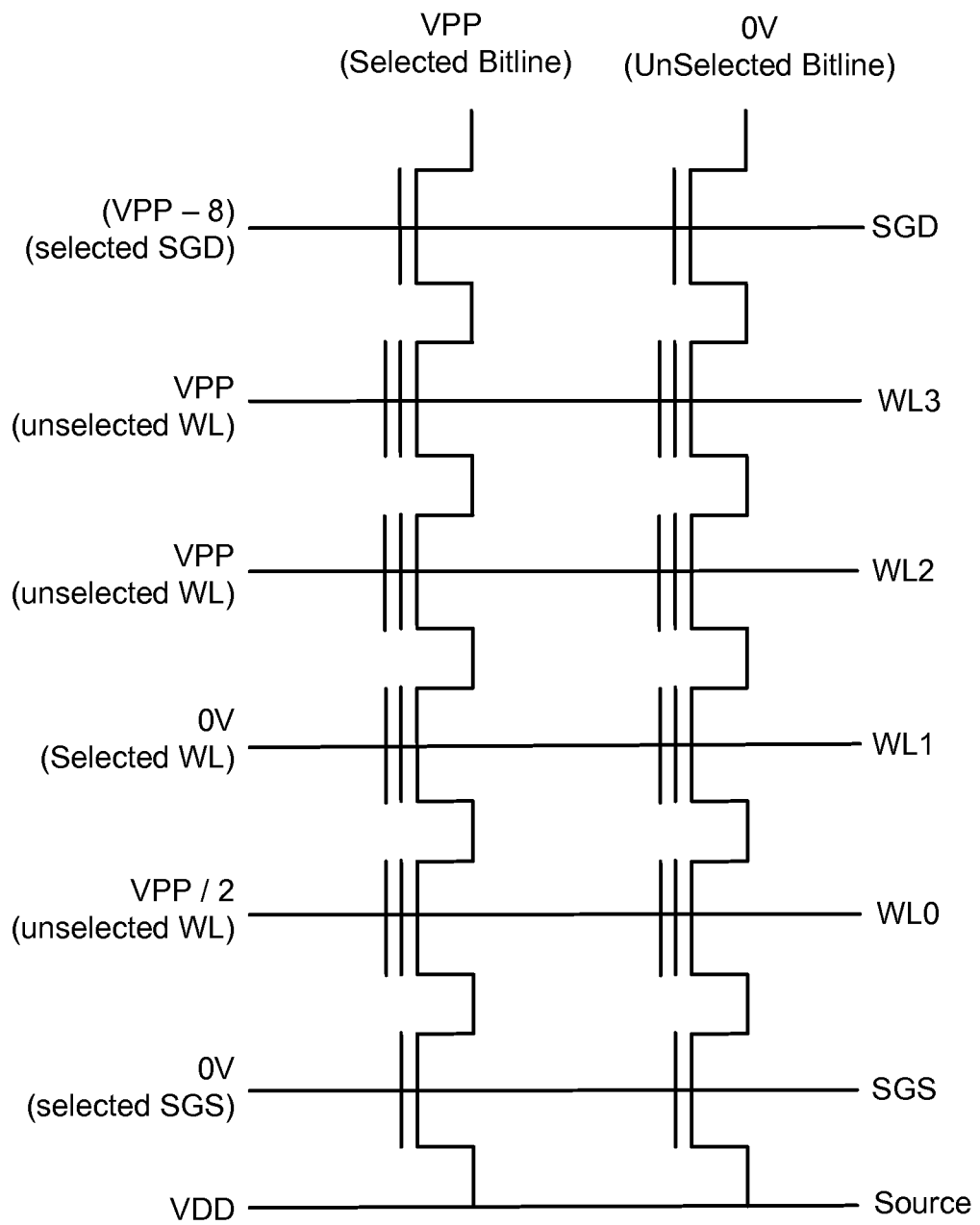
FIG. 11A depicts example programming conditions applied to a selected NAND string and an unselected NAND string in a 3D stacked memory device, in accordance with one embodiment.

FIG. 11A depicts example programming conditions applied to a selected NAND string and an unselected NAND string in a 3D stacked memory device, in accordance with one embodiment. Both of these NAND strings may be programmed during the same programming sequence. In one embodiment, programming proceeds from the source line to the bit line. Note that the selected and unselected NAND strings in FIG. 11A share a common SGD line, common SGS line, and the control gates of memory cells share common word lines. In one embodiment, memory cells in a block are programmed as a part of the same sequence.

Referring to FIG. 3A, the selected NAND string might be NS0 and the unselected NAND string might be NS4, as one example. In one embodiment, all of the NAND strings in the block are programmed in the same programming sequence. Thus, the selected and unselected NAND strings could be any of the NAND strings in the block, in one embodiment.

Recall that FIG. 3A is for an embodiment of U-shaped NAND strings. Straight NAND strings could also be used. Referring to FIG. 4C, the selected NAND string might be NS0B and the unselected NAND string might be NS0C.

In the embodiment of FIG. 11A, a programming voltage of VPP is applied to the selected bit line. VPP may be increased with each program loop. VPP may be a relatively high voltage such as about 10-20V, although it could be lower or higher. The selected WL has 0V applied. A voltage (VPP—8) is applied to SGD. This may transfer the voltage VPP to the source side of the SGD transistor. Unselected word lines that are between the selected WL and the bit line may have VPP applied thereto. This may transfer the bit line voltage to the drain side of the selected memory cell. If the drain side of the selected memory cell is at about VPP and its control gate is held at ground then electrons may be removed from the charge storage layer 297 of the selected memory cell. Recall that when the memory cells are erased that electrons may be added to the charge storage layer 297.

The unselected word lines between the source line and the selected word line may have VPP/2 applied thereto. In one embodiment, programming proceeds from the source line to the bit line. Thus, memory cells between the source line and the selected WL may have already been programmed. However, applying VPP/2 may prevent program disturb of these memory cells.

Memory cells between the selected word line and the bit line have not yet been programmed in one embodiment. Thus, they may still be in the erased state. Since the gate voltage and the channel voltage may be about the same (e.g., VPP), these memory cells should remain in the erased state. For example, electrons should not be removed from their charge storage layers 297.

The unselected bit line has 0V applied thereto. In one embodiment, this results in about 0V to the channel of the unselected NAND string, assuming an appropriate voltage is applied to the drain select gate. The memory cells on the unselected NAND string could have either VPP, VPP/2 or 0V applied to their control gates, depending on their location. Note that memory cells between the selected word line and the source line should have completed programming, under the assumption that programming is performed from the source line to the bit line. For such cells, there will be VPP/2 on the control gate and 0V in the channel. This voltage difference should not be enough to result in program disturb.

A memory cell that is on an unselected NAND string and that is associated with the selected word line should have just completed programming. Since this memory cell has 0V on its gate and about 0V in its channel it should not suffer from program disturb.

Memory cells between the selected word line and the bit line have not yet been programmed, for an embodiment in which programming is from source line to bit line. Thus, they should still be in the erased state. Since these memory cells have VPP on their gates and about 0V in their channels their Vt should not be lowered. Recall that memory cells may be erased by increasing the memory cell Vt. This may be accomplished by adding electrons to the charge storage layer 297. The high voltage to the gate combined in the low channel voltage should not result lowering of the Vt, in one embodiment.

Note that memory cells that have completed programming are inhibited from further programming without boosting the channel potential of the unselected NAND string, in one embodiment. Therefore, problems associated with leakage of boosted channel potential are avoided.

Other programming conditions depicted in FIG. 11A include VDD applied to the common source line and 0V applied to the SGS line. VDD may be a few volts, as one example.

Note that when programming NAND strings in a given block, memory cells in other blocks should not be affected. For example, if they have been programmed, then this programming should not be disturbed. However, the bit lines from the block being programmed are in communication with bit lines in other blocks, in one embodiment. For example, referring to FIG. 2B, BL0,0, which is in communication with NAND string NS0, may also be in communication with NAND strings in other blocks (not depicted in FIG. 2B). However, note that the word lines in those other blocks are controllable independently of the word lines in the selected block. In one embodiment, the voltages applied to word lines, select gates, and bit lines for NAND strings in unselected blocks may be similar to the programming conditions for the unselected NAND string depicted in FIG. 11A. Therefore, program disturb of NAND strings in unselected blocks may be avoided. For example, VPP/2 may be applied to word lines in the unselected block. Since the bit lines are shared with the selected block, the bit line voltages may be the programming voltage (selected bit line) or inhibit voltage (unselected bit line), depending on what is being applied to the bit lines in the block being programmed. The select gates in the unselected block may be biased in a similar manner as those in the block being programmed. The common source line may be biased in a similar manner as block being programmed.

However, note that the voltages applied in the unselected block could be considerably different from those applied in the selected block. In one embodiment, 0V is applied to the word lines in the unselected blocks. Further details of one embodiment in which 0V may be applied to the word lines in unselected blocks are discussed below.

Figure 11B:
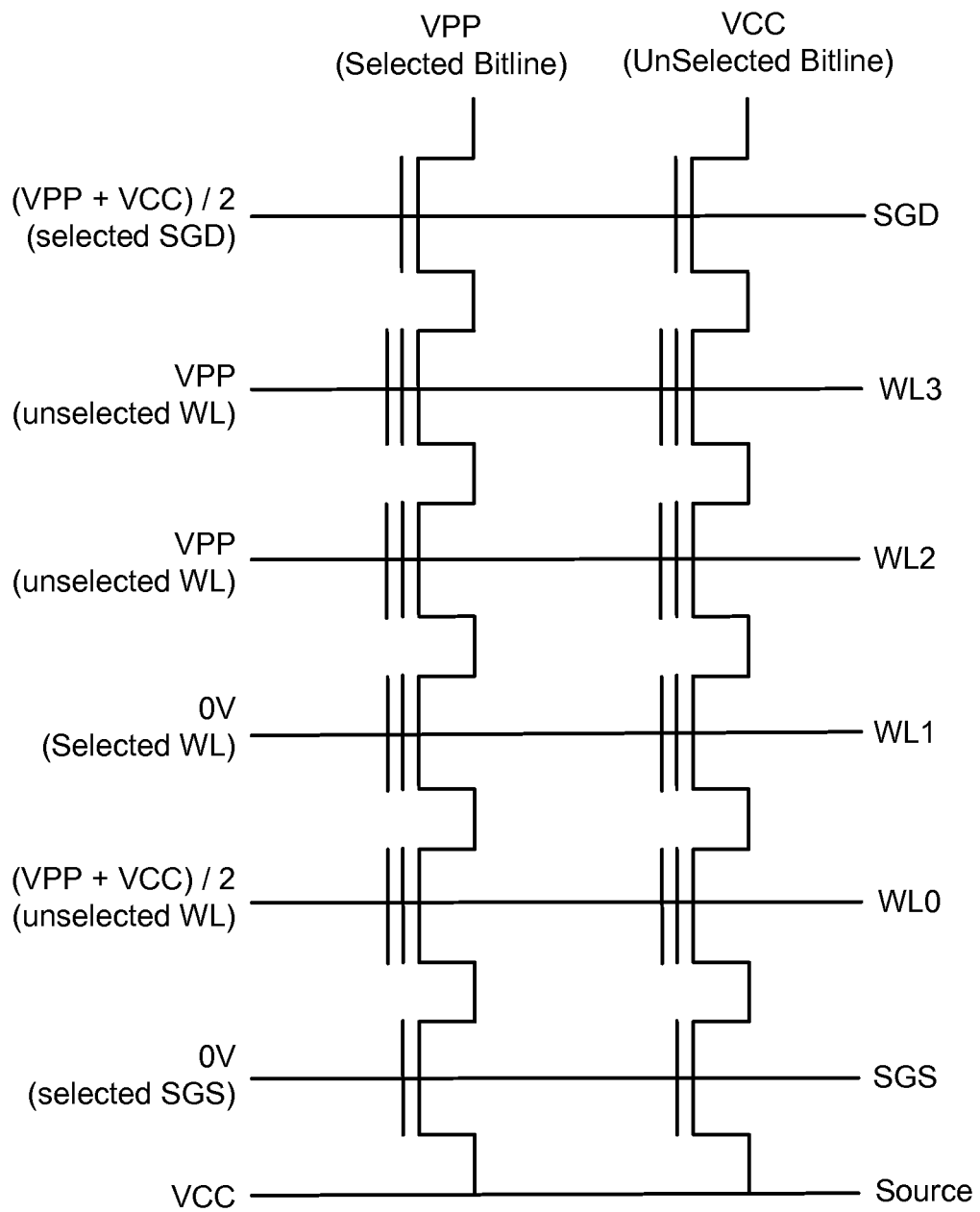
FIG. 11B depicts example programming conditions applied to a selected and an unselected NAND strings in a 3D stacked memory device, in accordance with one embodiment.

FIG. 11B depicts example programming conditions applied to a selected and an unselected NAND strings in a 3D stacked memory device, in accordance with one embodiment. These conditions may be used when programming all NAND strings in a block from source line to bit line, in one embodiment.

In this embodiment, VCC is applied to unselected bit lines. VCC may be about 3V. However, VCC may be higher or lower. The SGD line voltage is (VPP+VCC)/2 in this embodiment. Likewise, the voltage to unselected word lines between the source line and the selected word line is (VPP+VCC)/2. As noted, memory cells on these unselected word lines may have already been programmed. The common source line voltage is VCC. Voltages to the selected bit line, selected word line, and unselected word lines yet to be programmed may be the same as for the embodiment of FIG. 11A.

Note that the programming conditions are not limited to the two examples depicted in FIGS. 11A and 11B. In general, the voltage to the SGD line may be sufficient to pass the selected bit line voltage to the NAND string. The voltage to the unselected word lines between the selected word line and the bit line may be sufficient to pass the selected bit line voltage to the drain of the selected memory cell. This voltage may also be adequate to prevent programming of these unselected memory cells in the event that either the select or unselect bit line voltage is in the NAND string channel. The selected word line voltage may be sufficient to allow programming of the selected memory cell by removal of electrons from the charge storage layer 297 if the programming voltage from the selected bit line is in the channel of the selected memory cell. The voltage applied to the already programmed unselected word lines (between the source line and selected WL) may be sufficient to prevent program disturb whether the NAND string is presently selected or unselected.

FIG. 11C depicts a series of program and verify pulses that may be applied to a selected bit line during one embodiment of a programming operation. A programming operation may include multiple program-verify iterations, where each iteration applies a program voltage followed by verify voltages, to a selected bit line. In one possible approach, the program voltages are stepped up in successive iterations, as represented by VPP1 1150, VPP2 1152, VPP3 1154, and VPP4 1156. One or more verify voltages, such as example verify voltages Vva, Vvb and Vvc, may be provided after each program pulse. In some cases, one or more initial program pulses are not followed by verify pulses because it is not expected that any storage elements have reached their program state. Subsequently, program iterations may use verify pulses for the A-state, followed by program iterations which use verify pulses for the A- and B-states, followed by program iterations which use verify pulses for the B- and C-states, for instance.

FIG. 12 is a flowchart of one embodiment of applying program conditions to NAND strings in a 3D stacked memory device, in accordance with one embodiment. The process 1200 of FIG. 12 may be used in step 1020 of FIG. 10. Some of the steps of process 1200 are one embodiment of steps 902 and 904 of FIG. 9. FIGS. 13(A)-13(H) are diagrams showing timing of applying various programming conditions. In general, the diagram is divided into a Set Up phase, a Program phase, and a Discharge phase.

In step 1202, a voltage is applied to a common source line. This is depicted as VCell_Source applied in FIG. 13(H). This voltage may be applied at the beginning of the Set Up phase and continue to be applied during the Program phase.

Figure 13:
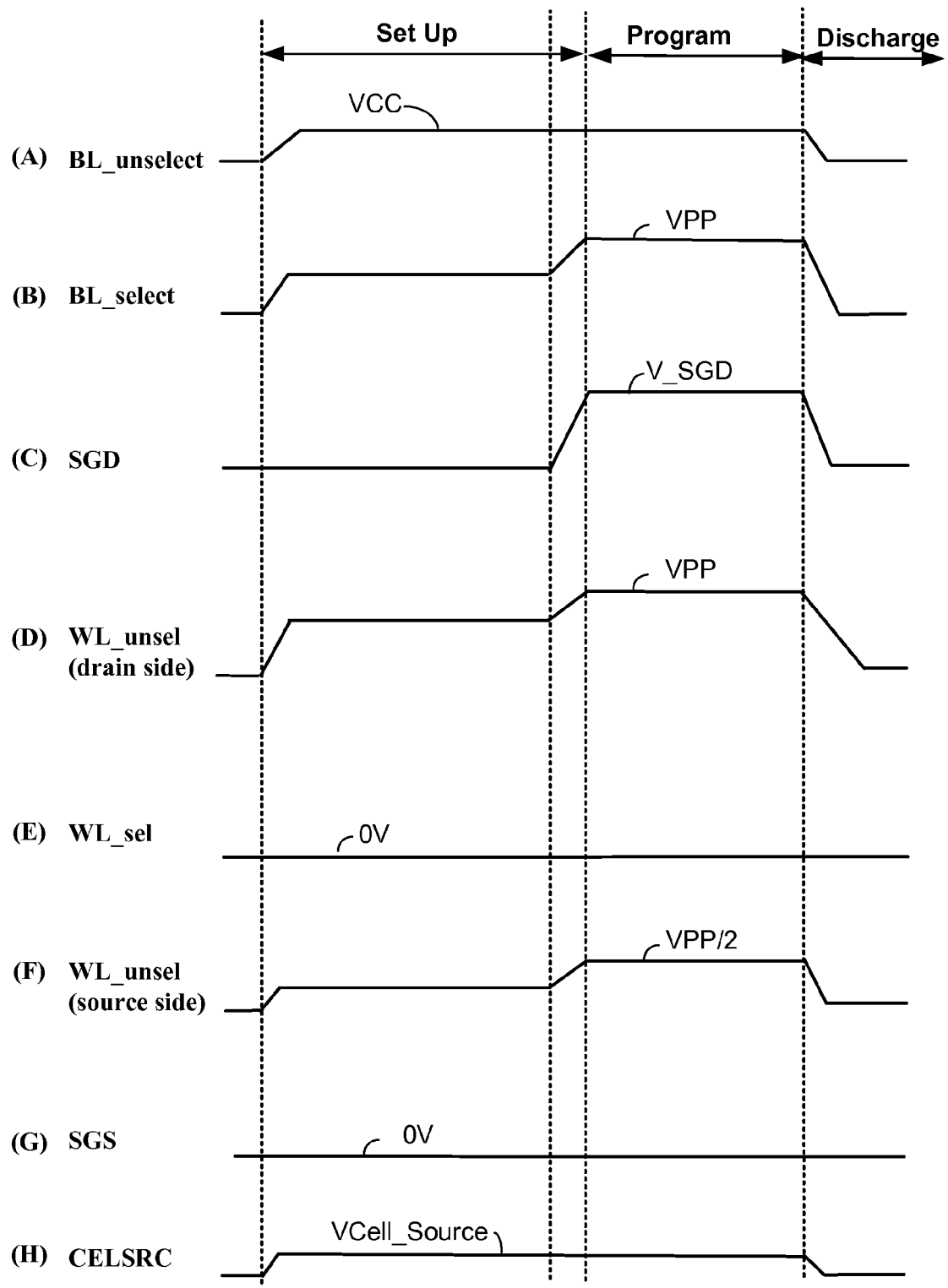
FIGS. 13(A)-13(H) are diagrams showing timing of applying various programming conditions during the process of FIG. 12.

In step 1204, a select voltage is applied to a source side select gate. This is depicted in FIG. 13(G). In this example, the voltage is 0V, but could be another value. This may be applied during both the Set Up and Program phases.

In step 1206, a voltage is applied to a selected word line. This is depicted in FIG. 13(E). In this example, the voltage is 0V, but could be another value. This may be applied during both the Set Up and Program phases.

In step 1208, a voltage is applied to unselected bit lines. This voltage may be referred to as an inhibit voltage. This is depicted in FIG. 13(A). In this example, the voltage is VCC, but could be another value. VCC may be about 3V, but could be higher or lower. This inhibit voltage may be applied during both the Set Up and Program phases.

In steps 1210-1214 voltages are applied to the unselected word lines that are yet to be programmed, the unselected word lines that have already been programmed, and the selected bit lines. In one embodiment, this includes applying voltages during the Program phase. There may also be a voltage applied during the Set Up phase.

In step 1210, a voltage is applied to unselected word lines that are yet to be programmed. This is depicted in FIG. 13(D). During the Set Up phase the voltage may be increased to a value between 0V and VPP. At the end of the Set Up phase the voltage may be increased to VPP and maintained at VPP During the Program phase.

In step 1212, a voltage is applied to unselected word lines that have already been programmed. This is depicted in FIG. 13(F). During the Set Up phase the voltage may be increased to a value between 0V and VPP/2. At the end of the Set Up phase the voltage may be increased to VPP/2 and maintained at VPP/2 During the Program phase. Note that the voltage during the program phase of VPP/2 is one example.

In step 1214, a voltage is applied to a selected bit lines. This is depicted in FIG. 13(B). During the Set Up phase the voltage may be increased to a value between 0V and VPP. At the end of the Set Up phase the voltage may be increased to VPP and maintained at VPP During the Program phase.

In step 1216, a voltage is applied to a drain side select gate. This is depicted in FIG. 13(C). In one embodiment, the voltage may be increased to V_SGD at the end of the Set Up phase and maintained at V_SGD during the Program phase.

After the program phase the voltages may be discharged.

In one embodiment, an extra SGD transistor is used on the NAND strings. FIG. 14A depicts a cross-sectional view of a portion of one embodiment of the block 200 of FIG. 2A, along line 220. The stack includes alternating dielectric and conductive layers. The dielectric layers include D0 to D6 and may be made of SiO2, for instance. The conductive layers include BG, which is a back gate layer, WL0 to WL3, which form word line layers, e.g., conductive paths to control gates of the memory cells at the layer. There are also two SG layers, SGA1 and SGA2. Each select gate layer forms a conductive path to control gates of select gate transistors of NAND strings, in one embodiment. In one embodiment, each NAND string has two select gate transistors in series. Short dashed lines depict memory cells and select gate transistors, as discussed further below.

The SGD transistors are long-channel transistors, in one embodiment. The voltage combination on two long-channel SGD transistors in series is expected to effectively bring all NAND strings in unselected block near 0V regardless of their respective select/unselect write condition on the bit line. To sustain a high VPP, the SGD oxide may be thicker than the tunnel oxide of memory cells, in one embodiment. This can be achieved by lack (or selective removal) of the memory nitride layer in SGD transistors, thus letting their gate oxide grow thicker during nitride oxidation for memory transistors.

Figure 14B:
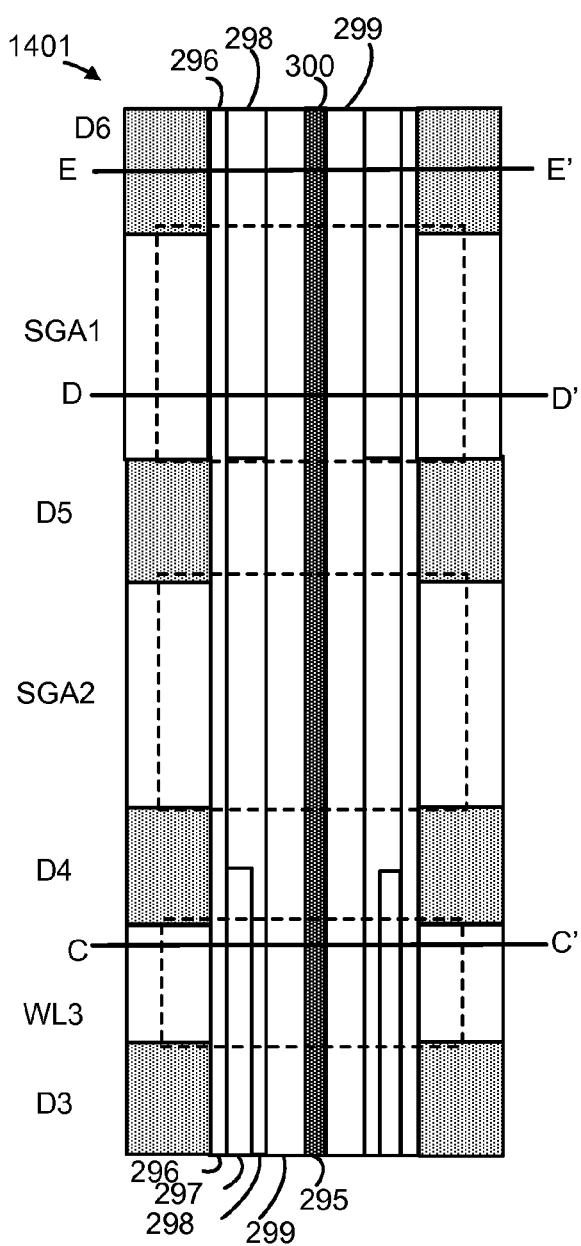
FIG. 14B shows portions of the dielectric layers D3 to D6 and the conductive layers WL3, SGA1 and SGA2.
Figure 14E:
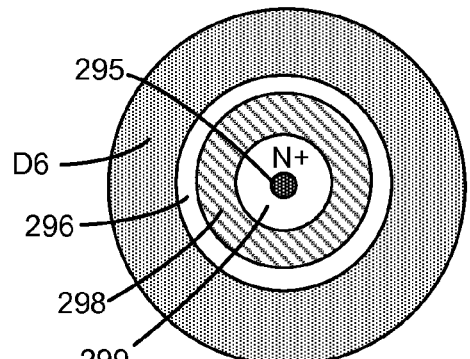
FIG. 14E depicts a cross section of the column at line E-E' in FIG. 14B.
Figure 14D:
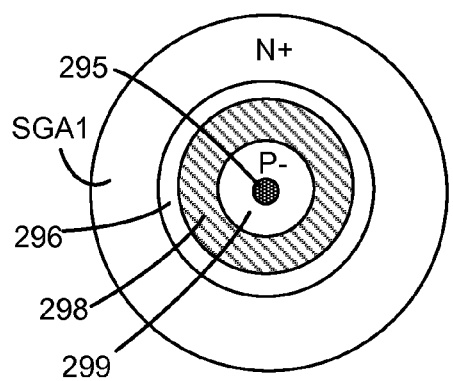
FIG. 14D depicts a cross section of the column at line D-D' in FIG. 14B.
Figure 14C:
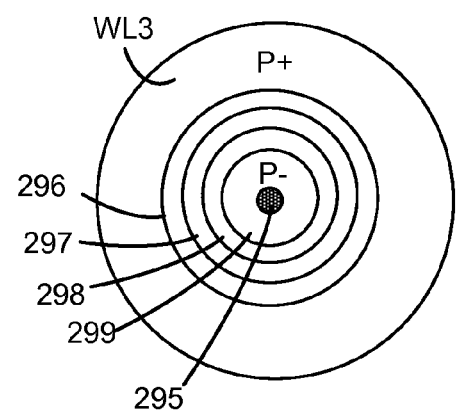
FIG. 14C depicts a cross section of the column at line C-C' in FIG. 14B.

FIG. 14B shows portions of the dielectric layers D3 to D6 and the conductive layers WL3, SGA1 and SGA2. Each column includes a number of layers which are deposited along the sidewalls of the column. In this embodiment, the SGA1 and SGA2 layers are formed differently than the word line layers. FIG. 14C depicts a cross section of the column at line C-C' in FIG. 14B. Thus, it shows a cross section of a memory cell and surrounding word line layer. FIG. 14D depicts a cross section of the column at line D-D' in FIG. 14B. Thus it shows a cross section of a select gate transistor and surrounding select line layer. FIG. 14E depicts a cross section of the column at line E-E' in FIG. 14B. Thus it shows a cross section in the dielectric layer D6 and the memory column in that region, which is between the select gate transistor and the bit line.

The word line layers can include oxide-nitride-oxide and polysilicon layers which are deposited, e.g., using atomic layer deposition. For example, a block oxide can be deposited as layer 296, a nitride such as SiN as a charge trapping layer can be deposited as layer 297, a tunnel oxide can be deposited as layer 298, a polysilicon body or channel can be deposited as layer 299, and a core filler dielectric can be deposited as region 295. Additional memory cells are similarly formed throughout the columns.

The select gate layers (SGA1, SGA2) may include a block oxide layer 296, a tunnel oxide layer 298, a polysilicon body or channel layer 299, and a core filler dielectric region 295. Thus, a difference between the word line layers and select gate layers is the absence of the charge trapping layer 297 in the select gate layers. During fabrication one option is to not deposit the charge trapping layer 297 in the select gate layers. Another option is to initially deposit the charge trapping layer 297 in both the word line and select gate layers, but selectively remove the charge trapping layer 297 from the select gate layers. Because of the lack of the charge trapping layer 297, the tunnel oxide layer 298 may be thicker in the select gate layers than in the memory cell layers.

In one embodiment, the word line layers are P+. Thus, the gates of the memory cells may be P+. In one embodiment, the SGA1 and SGA2 layers are N+. Thus, the gates of the drain side select transistors may be N+. In one embodiment, the polysilicon layer 299 is P+ at layer D6. However, the polysilicon layer 299 may be N− for the rest of the NAND string. For example, polysilicon layer 299 is depicted as N+ in FIG. 14E and as P− in FIGS. 14C and 14D.

In one embodiment, this doping may facilitate erasing the NAND string by applying a high voltage to all word lines (with a low voltage in the NAND channel) and verifying that the memory cells have gone conductive. Further details are discussed below. Note that a different doping scheme could be employed.

NAND strings having two drain side select transistors may be configured as U-shaped NAND strings, similar to the embodiment depicted in FIG. 3A. NAND strings having two drain side select transistors may be configured as straight NAND strings, similar to the embodiment depicted in FIG. 4B. In one embodiment, straight NAND strings have two drain side select transistors. Doping of the straight NAND strings may be similar to the doping for the U-shaped NAND string.

FIG. 15 depicts a cross-sectional view of a portion 488 of one embodiment of block 480 of FIG. 4A along line 486. Columns of memory cells corresponding to NAND strings NS8 to NS11 are depicted in the multi-layer stack. In FIG. 15, there are seven dielectric layers D0A-D7A. Layer SGDA is for a first drain side select transistor for each NAND string. Layer SGDB is for a second drain side select transistor for each NAND string.

The stack 1590 includes a substrate 101, an insulating film 250 on the substrate, and a portion of a source line SL0A. Recall that the additional straight NAND strings in a SGD line subset extend in front of and in back of the NAND strings depicted in the cross-section, e.g., along the x-axis. NS8 has a source end 494 and a drain end 492. The slit 482 from FIG. 4A is also depicted with other slits. A portion of the bit lines BL0A8-BL0A11 are also depicted. Dashed lines depict memory cells and select gate transistors.

As with the U-shaped embodiment, the SGD transistors may be two long-channel SGD transistors in series. These SGD transistors may be expected to effectively bring all strings in unselected blocks near 0V regardless of their respective select/unselect write condition and bit line voltages. To sustain a high selected bit line voltage (e.g., VPP), the SGD oxide may be thicker than the tunnel oxide of memory cells in one embodiment. The columns for the straight NAND strings may be similar to the columns depicted in FIGS. 14B-14D. As already discussed, the charge trapping layer 297 is not required in the select gate layers. Thus, layers SDGA and SGDB in FIG. 15 may be configured similar to the example depicted in FIGS. 14B and 14D. Doping may be similar to the U-shaped NAND string example of FIGS. 14B-14E.

In one embodiment, the programming conditions applied to NAND strings having two SGD transistors in the selected block are similar to those depicted in FIG. 11A. In one embodiment, the programming conditions applied to the NAND strings in the selected block are similar to those depicted in FIG. 11B. The same voltage may be applied to each of the SGD transistors in the selected block.

Figure 16:
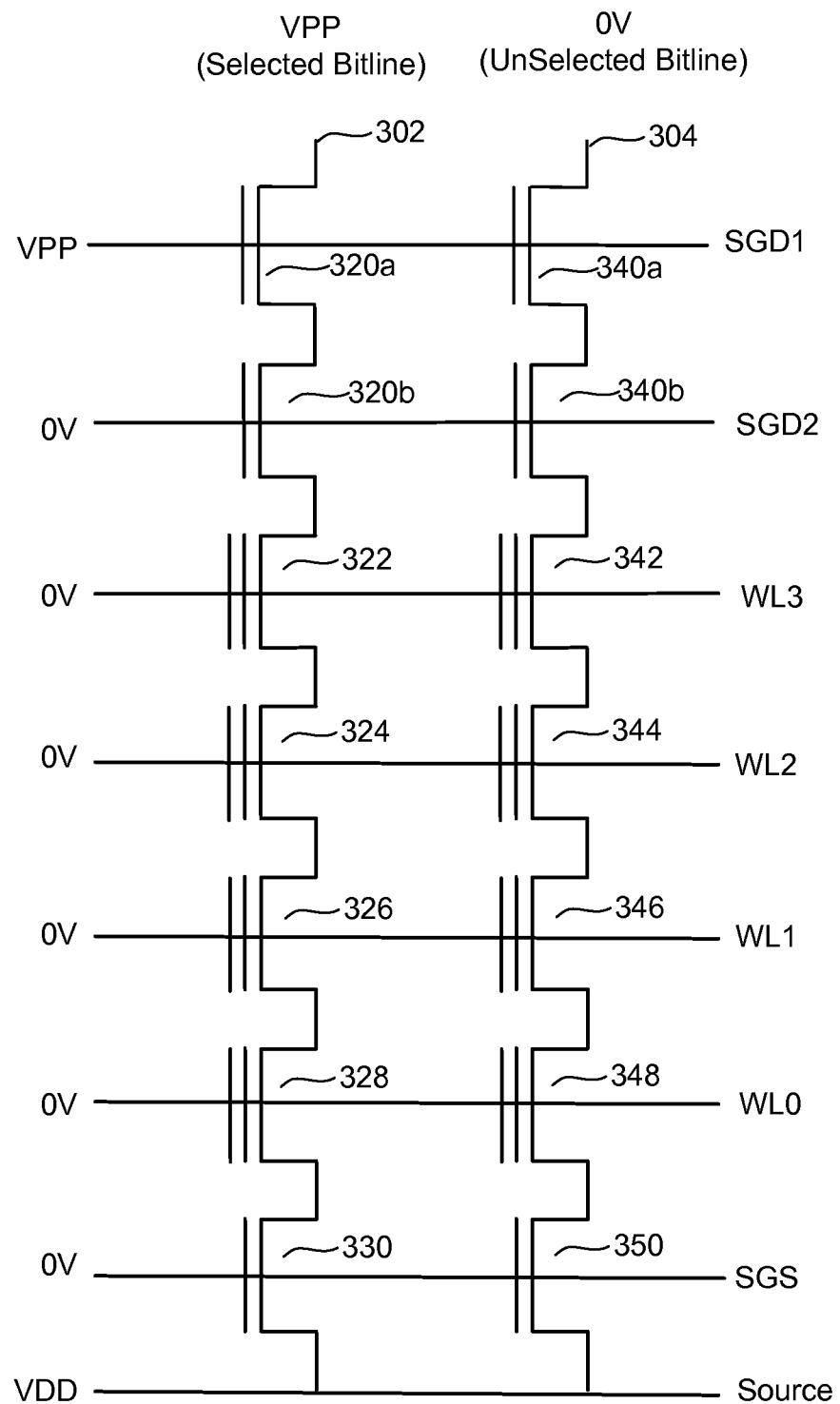
FIG. 16 shows example voltages for one embodiment of an unselected block in which NAND strings have two SGD transistors.

In one embodiment, the voltages applied to the NAND strings having two SGD transistors in the unselected block are those depicted in FIG. 16. Note that there could be a selected bit line coupled to the unselected block because a bit line may be shared by multiple blocks. In other words, a bit line may be in communication with NAND strings in multiple blocks. Thus, in FIG. 16, the "selected bitline" does not mean that the NAND string in the unselected block is selected for programming. Rather, it means that the NAND string shares a bit line with a NAND string in another block that is selected for programming.

In one embodiment, VPP is applied to the SGD transistor that is nearest the bit line. In one embodiment, the voltage applied to SGD1 is slightly less than VPP. For example, it may be about 1V less than VPP. In one embodiment, 0V is applied to the SGD transistor that is nearest the NAND string. The voltage applied to this second SGD transistor may be greater than 0V. For example, it may be between about 0V and 3V, in one embodiment. The voltage that is applied to the second SGD transistor may be referred to as an inhibit voltage.

In one embodiment, all of the word lines in the unselected block have 0V applied to them. Therefore, program disturb is avoided or reduced since the channel should be at about 0V. Note that a different voltage could be applied to the word lines in the unselected block. For example, the voltage may be between about 0V and 3V, in one embodiment.

FIGS. 17(A)-17(G) illustrate timing of applying various voltages in the unselected block while programming NAND strings in a different block. Thus, note that the voltages pertain to an unselected block. The timing diagrams may be used when applying the voltages depicted in FIG. 16.

In general, the diagrams of FIGS. 17(A)-17(G) are divided into a Set Up phase, a Program Inhibit phase, and a Discharge phase. The following may occur during the Set Up phase. At the beginning of the Set Up phase, the voltage of the unselected bit lines are brought to VCC (FIG. 17(A)). In this example, the voltage is VCC, but could be another value. VCC may be about 3V, but could be higher or lower. Also, the voltage on the selected bit lines is raised to a value between 0V and VPP (FIG. 17(B)). The voltage on the drain side select gate nearest the bit line is brought to a voltage between 0V and VPP (FIG. 17(C)). The voltage on the other drain side select gate nearest may be kept at 0V (FIG. 17(D)). The voltages on the unselected word lines (this may be all WLs in the unselected block) may be brought to 0V (FIG. 17(E)). The voltage on the source side select gate may be brought to 0V (FIG. 17(F)). The voltage on the common source line may be brought to VCell_Source (FIG. 17(G)).

Figure 17:
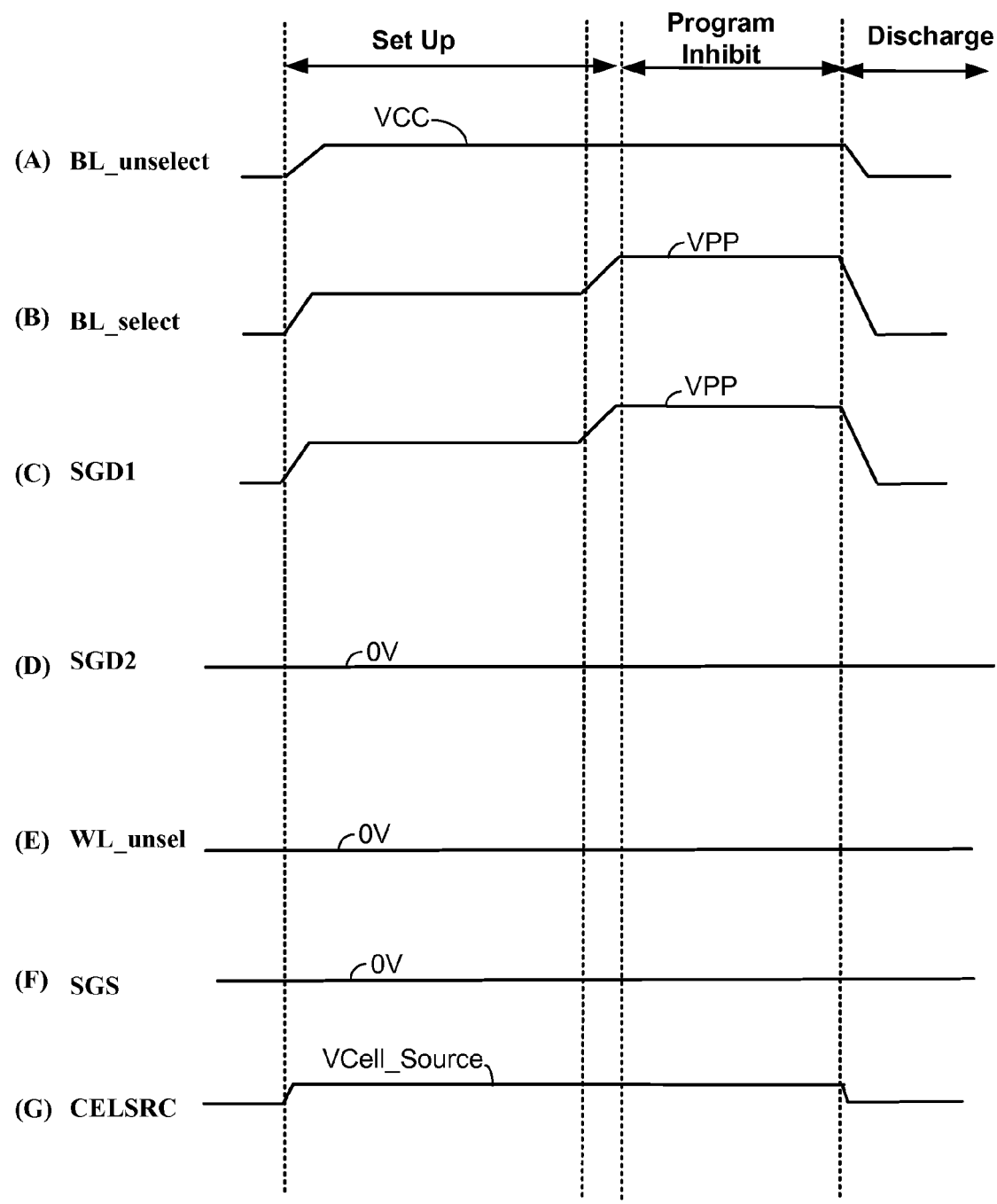
FIGS. 17(A)-17(G) are diagrams illustrating timing of applying various voltages in a block that is not selected for programming.

At the end of the Set Up phase, the voltage on the selected bit lines may be raised to VPP and maintained there during the Program Inhibit phase (FIG. 17(B)). At the end of the Set Up phase, the voltage on the drain side select gates nearest the bit line may be raised to VPP and maintained there during the Program Inhibit phase (FIG. 17(C)). Other voltages may be maintained at their levels from the Set Up phase.

After the program phase the voltages may be discharged.

Figure 18A:
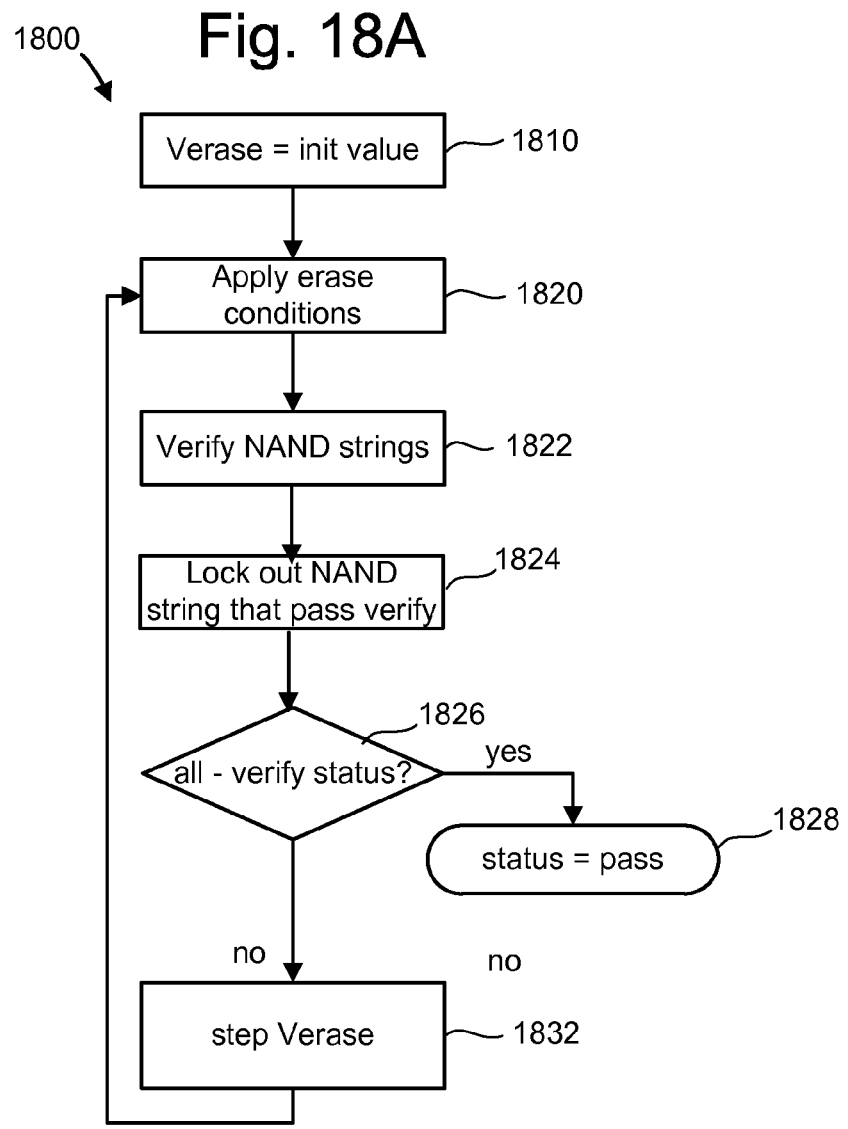
FIG. 18A is a flowchart of one embodiment of a process of erasing memory cells in a 3D stacked memory device.
Figure 18B:
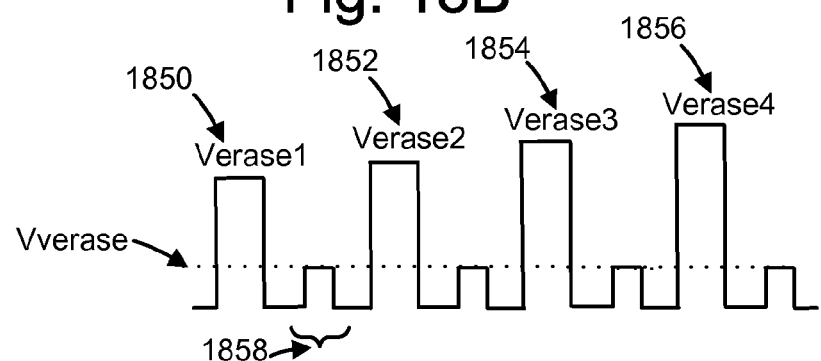
FIG. 18B is a diagram of example erase voltages applied to word lines during one embodiment process of FIG. 19A.

FIG. 18A is a flowchart of one embodiment of a process 1800 of erasing memory cells in a 3D stacked memory device. Process 1800 is one embodiment of step 602 of process 600. Process 1800 could be applied to a unit of memory cells such as a block. However, a different unit could be erased together. FIG. 18B is a diagram of example erase voltages applied to word lines during one embodiment process 1800. FIG. 19(A)-19(F) are diagrams of timing of voltages applied during one embodiment of process 1800.

In step 1810, an initial erase voltage is established. In step 1820, erase conditions are applied. FIG. 19(A)-19(F) are timing diagrams illustrating voltages during erase operations, according to one embodiment. The voltages shown are applied to word lines, bit lines, and the common source line of the memory array, for NAND strings being erased and being inhibited from further erase. The erase operation can be grouped into a Bit Lines Precharge Phase, an Erase Phase and a Discharge Phase.

Bit Lines Precharge Phase: During phase (1), the SGS transistors are turned off by SGS being at Vsgs (FIG. 19(A)) while the SGD transistors are turned on by SGD going high to Vsg (FIG. 19(B)), thereby allowing a bit line to access a NAND string. During phase (2), the bit line voltage of an erase-inhibited NAND string is allowed to rise to a predetermined voltage given by VBL_inhibit (FIG. 19(D)). When the bit line voltage of the erase-inhibited NAND string rises to VBL_inhibit, the erase-inhibited NAND string will float when the gate voltage on the SGD transistor drops to V_SGD.

Figure 19:
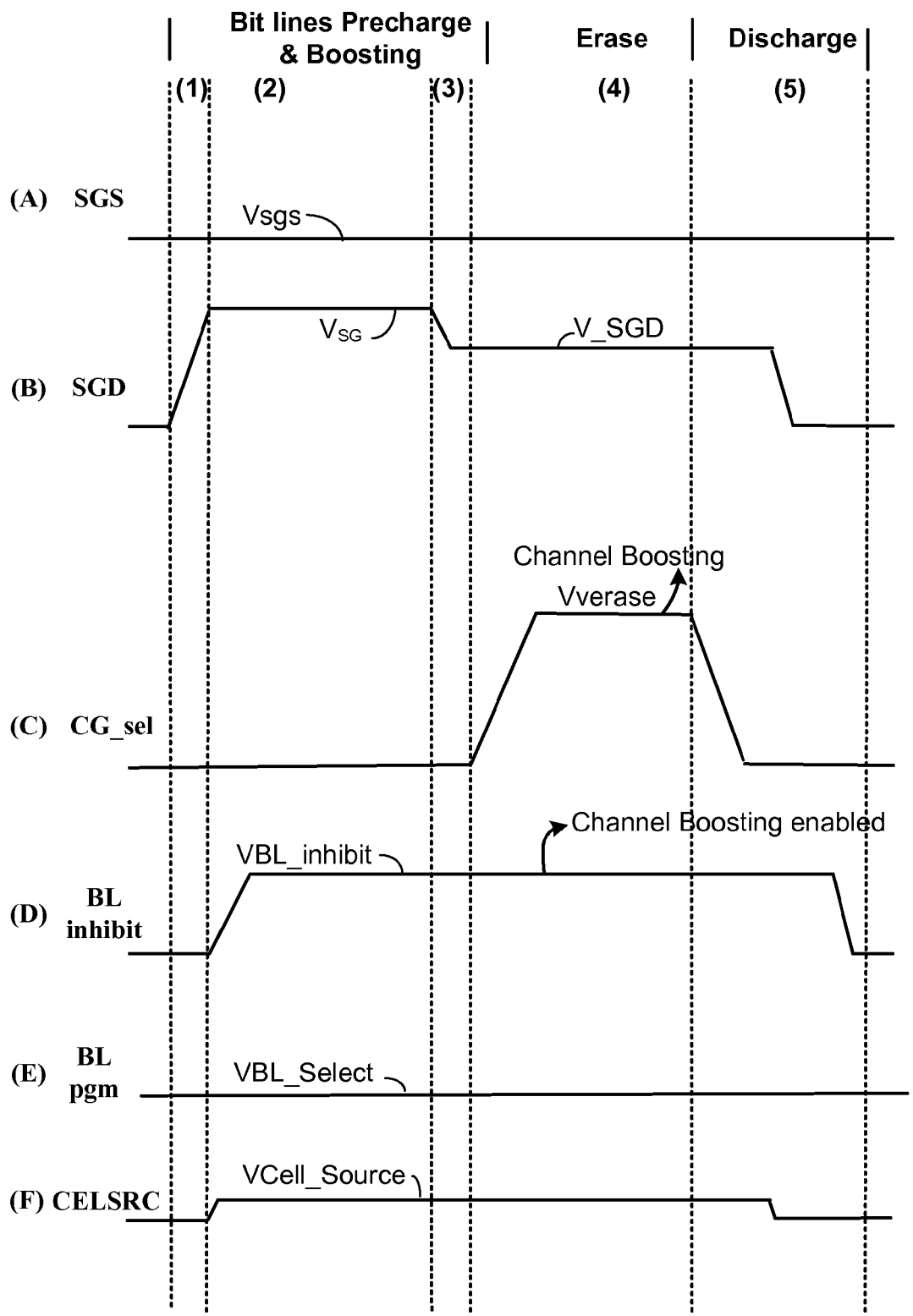
FIG. 19(A)-19(F) are diagrams of timing of voltages applied during one embodiment of process of FIG. 18A.
Figure 20:
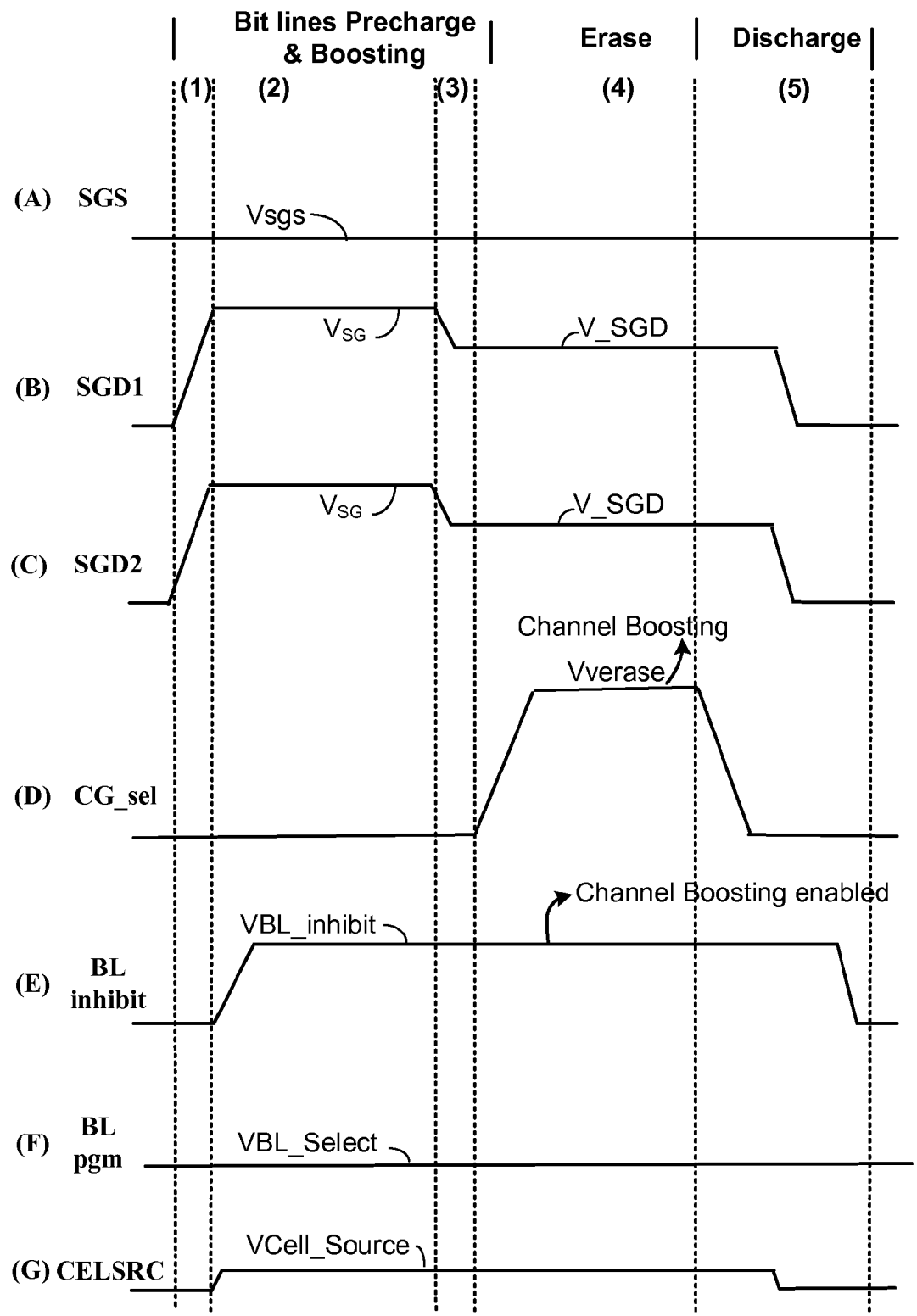
FIG. 20(A)-20(G) are timing diagrams illustrating voltages during erase operations, according to one embodiment.

At the same time, the bit line voltage of a NAND string being erased is established at VBL_Select if not already there (FIG. 19(E)). Also during phase (2), the voltage on the common source line is set to voltage given by V_Cell_Source (FIG. 19(F)).

During phase (3), the drain select line (SGD) connecting to the SGD transistors of NAND strings has its voltage lowered to V_SGD. In one embodiment, this will float only those erase-inhibited NAND strings where their bit line voltage is comparable to V_SGD, since their SGD transistors are turned off (FIGS. 9(B) & 9(D)). As for the NAND strings containing a memory cell to be erased, their SGD transistors will not be turned off relative to the bit line voltage (e.g., near 0V) at their drain.

Erase Phase: During phase (4), an erase voltage Verase is applied to the word lines in the block, or other unit being erased (FIG. 9(C)). The memory cells under erase inhibition (e.g., with boosted channels) will not be erased further. The memory cells being erased will be erased further. For example, they may have their threshold voltages increased by the addition of electrons to their charge storage layer 297.

In the Discharge Phase (5), the various control lines and bit lines are allowed to discharge.

After applying the erase conditions (step 1820), the NAND strings are verified in step 1822. NAND strings may be verified by applying Vv-erase to word lines associated with the NAND strings being erased. For example, verify voltage 1858 depicted in FIG. 18B may be applied to word lines. Note that memory cells are being erased to a non-conductive state, in one embodiment. For the earlier erase iterations, the verify voltage 1858 could be applied to all word lines. If the NAND string conducts, then all memory cells are still in the conductive state and the NAND string is not yet erased. If the NAND string does not conduct with Vv-erase applied to all word lines, then there is at least one memory cell that has been erased to the non-conductive state. At this point, a finer test may be performed in which Vv-erase is applied to word lines individually, with a Vread applied to all other word lines. This finer test can determine whether each individual memory cell is erased. A NAND string may be considered erased when all memory cells on the string pass erase verify, in one embodiment. Other techniques may be used to determine whether a NAND string passes erase verify.

In step 1824, NAND strings that passed erase verify are locked out from further erase. This may be achieved by storing a bit in a latch associated with the NAND string that indicates what voltage should be applied to the bit line. As depicted in FIG. 19(D) inhibited NAND strings may have VBL_inhibit applied to their bit lines.

In step 1826, it is determined whether the erase operation is finished. This may be determined based on all of most of the NAND strings being verified. In one embodiment, not all of the NAND strings need to pass erase verify. If erase is finished, then the process 1800 concludes at step 1828.

In step 1832, the erase voltage is stepped up. For example, the next erase voltage in the sequence 1850, 1852, 1854, 1856, etc. is established. The process then returns to step 1820 to apply the erase conditions again. In some embodiments, there is a limit to the number of iterations of process 1800. Thus, there may be a test of how may erase pulses have been applied. If the limit has been reached without enough NAND strings passing verify, the process 1800 may end with erase failing.

In some embodiments, the NAND strings have two drain side select transistors. FIG. 20(A)-20(G) are timing diagrams illustrating voltages during erase operations, according to one embodiment. These may be applied during one embodiment of step 1820 of process 1800.

One embodiment includes a method of operating 3D stacked non-volatile storage comprising a plurality of word lines comprising conductive material that is oriented horizontally. The conductive material alternates with dielectric material in a stack. The 3D stacked non-volatile storage also comprises a plurality of NAND strings that are oriented vertically. The method comprises erasing a group of non-volatile storage elements associated with a set of NAND strings of the plurality of NAND strings to an erase threshold voltage distribution above zero volts. The method also includes programming selected non-volatile storage elements in the group by reducing the threshold voltage of the selected non-volatile storage elements. The programming includes establishing a programming voltage in channels associated with selected NAND strings of the set of NAND strings.

One embodiment includes a 3D stacked non-volatile memory device, comprising a plurality of word lines, a plurality of NAND strings, a plurality of bit lines, and one or more managing circuits in communication with the plurality of word lines, the plurality of bit lines, and the plurality of NAND strings. The word lines comprise conductive material that is oriented horizontally. The conductive material alternates with dielectric material in a stack. The NAND strings are oriented vertically. Each NAND string comprises a set of non-volatile storage elements and a drain side select gate (SGD) at a first end of each NAND string. Each bit line is coupled to the drain side select gate of one of the NAND strings. The one or more managing circuits erase non-volatile storage elements of a set of NAND strings of the plurality of NAND strings to an erase threshold distribution above zero volts. The one or more managing circuits program selected non-volatile storage elements of the set of NAND strings by reducing threshold voltages of the selected non-volatile storage elements below the erase threshold distribution. The programming includes establishing a programming voltage in channels associated with selected NAND strings of the set of NAND strings.

One embodiment includes a method of programming 3D stacked non-volatile storage that comprises a plurality of word lines comprising conductive material that is oriented horizontally, a plurality of NAND strings that are oriented vertically, and a plurality of bit lines. The conductive material alternates with dielectric material in a stack. Each NAND string comprises a set of non-volatile storage elements and a drain side select gate at a first end of each NAND string. Each bit line is coupled to the drain side select gate of a set of the plurality of NAND strings. The method comprises applying a select voltage to drain side select gates of a group of NAND strings of the plurality of NAND strings while applying a programming voltage to a selected bit line associated with a selected NAND string of the group of NAND strings to pass the programming voltage to a channel of the selected NAND string. The method also comprises applying a first voltage to a selected word line associated with the selected NAND string while the programming voltage is in the channel of the selected NAND string. The selected NAND string has a selected non-volatile storage element associated with the selected word line. The method also comprises applying a second voltage to all unselected word lines associated with the selected NAND string that are between the selected word line and a source select gate while the programming voltage is in the channel of the selected NAND string to prevent programming of any non-volatile storage elements on the selected NAND string that have already been programmed. The method also comprises applying a third voltage to all unselected word lines associated with the selected NAND string that are between the selected word line and the drain select gate of the selected NAND string while the programming voltage is in the channel of the selected NAND string. The third voltage allows the programming voltage to pass to a channel of the selected non-volatile storage element and prevents programming of any non-volatile storage element on the selected NAND string between the selected word line and the drain side select gate.

One embodiment includes a 3D stacked non-volatile memory device, comprising a plurality of bit lines, a plurality of source lines, a plurality of word lines comprising conductive material that is oriented horizontally, a plurality of layers of dielectric material that alternates with the plurality of word lines in a stack; a plurality of NAND strings that are oriented vertically, and one or more managing circuits in communication with the plurality of word lines, the plurality of bit lines, the plurality of source lines, the drain side select gates, and the source side select gates. Each NAND string comprises a set of non-volatile storage elements, a drain side select gate at a first end of the NAND string, and a source side select gate at a second end of the NAND string. The drain side select gate of each NAND string is coupled to one of the bit lines. The source side select gate of each NAND string coupled to one of the source lines. The one or more managing circuits apply a select voltage to drain side select gates of a group of NAND strings of the plurality of NAND strings while applying a program voltage to selected bit lines associated with selected NAND strings of the group of NAND strings to pass the program voltage to channels of the respective selected NAND strings. The one or more managing circuits apply a first voltage to a selected word line associated with the group of NAND strings while the program voltage is in the channels of the selected NAND strings. The one or more managing circuits apply a second voltage to all unselected word lines associated with the selected NAND strings that are between the selected word line and the source select gates of the selected NAND strings while the program voltage is in the channels of the selected NAND strings to prevent programming of any non-volatile storage elements on the selected NAND strings that have already been programmed. The one or more managing circuits apply a third voltage to all unselected word lines associated with the selected NAND strings that are between the selected word line and the drain select gates of the selected NAND strings while the program voltage is in the channels of the selected NAND strings. The third voltage allows the program voltage to pass to channels of selected non-volatile storage elements and prevents programming of any non-volatile storage element on the selected NAND string between the selected word line and the drain side select gate.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of operating 3D stacked non-volatile storage comprising a plurality of word lines comprising conductive material that is oriented horizontally, the conductive material alternates with dielectric material in a stack, and a plurality of NAND strings that are oriented vertically, the method comprising:

erasing a group of non-volatile storage elements associated with a set of NAND strings of the plurality of NAND strings to an erase threshold voltage distribution above zero volts; and programming selected non-volatile storage elements in the group by reducing the threshold voltage of the selected non-volatile storage elements, including establishing a programming voltage in channels associated with selected NAND strings of the set of NAND strings, wherein the programming selected non-volatile storage elements further comprises applying a sequence of voltages to a selected word line associated with the selected NAND strings, and applying a voltage to a first bit line associated with a first selected NAND string of the selected NAND strings that increases in magnitude with later voltages in the sequence of voltages applied to the selected word line until a first of the selected non-volatile storage elements that is on the first selected NAND string is programmed.

2. The method of claim 1, wherein each voltage in the sequence of voltages applied to the selected word line is lower than the voltage applied to the first bit line.

3. The method of claim 1, further comprising:

applying an inhibit voltage to an unselected bit line that is associated with an unselected NAND string of the set of NAND strings;

applying a voltage to a drain select gate associated with the unselected NAND string to pass the inhibit voltage to a channel of the unselected NAND string; and applying a voltage to an unselected word line associated with the unselected NAND string to prevent programming of a non-volatile storage element on the unselected NAND string.

4. The method of claim 1,
wherein the establishing a programming voltage in channels associated with selected NAND strings of the set of NAND strings includes applying the programming voltage to selected bit lines associated with the selected NAND strings while applying a voltage to select gates of the selected NAND strings to pass the programming voltage to channels of the selected NAND strings; and
wherein the applying a sequence of voltages to a selected word line associated with the selected NAND strings includes applying a voltage to the selected word line while the programming voltage is in the channels of the selected NAND strings to program the first selected non-volatile storage element that is on the first selected NAND string.

5. The method of claim 4, wherein the programming selected non-volatile storage elements further includes:
applying a first voltage to an unselected word line associated with the first selected NAND string while the programming voltage is in the channel of the first selected NAND string that prevents programming of a non-volatile storage element on the first selected NAND string that has already been programmed; and
applying a second voltage to any unselected word lines associated with the first selected NAND string that are between the selected word line and the bit line of the first selected NAND string while the programming voltage is in the channel of the first selected NAND string, the second voltage allows the programming voltage to pass to a channel of the first selected non-volatile storage element.

6. The method of claim 5, wherein the set of NAND strings are in a first block that is selected for programming, the plurality of NAND strings includes a set in a second block, each NAND string in the second block comprising a drain side select gate at a first end of each NAND string, the drain side select gate of the NAND strings in the second block including a first transistor and a second transistor, the first transistor is closer to a bit line associated with the NAND string than the second transistor, a first NAND string in the second block shares a bit line with the first selected NAND string in the first block, and further comprising:
applying a voltage that is equal to the programming voltage to the first transistor of drain side select gates of NAND strings in the second block;
applying an inhibit voltage to the second transistor of drain side select gates of NAND strings in the second block; and
applying the inhibit voltage to all word lines in the second block.

7. A 3D stacked non-volatile memory device, comprising:
a substrate;
a plurality of word lines comprising conductive material that is oriented horizontally with respect to the substrate, the conductive material alternates with dielectric material in a stack;
a plurality of NAND strings that are oriented vertically with respect to the substrate, each NAND string comprising a set of non-volatile storage elements and a drain side select gate at a first end of each NAND string;
a plurality of bit lines, each bit line coupled to the drain side select gate of one of the NAND strings; and
one or more managing circuits in communication with the plurality of word lines, the plurality of bit lines, and the plurality of NAND strings, the one or more managing circuits are configured to erase non-volatile storage elements of a set of NAND strings of the plurality of NAND strings to an erase threshold distribution above zero volts, the one or more managing circuits are configured to program selected non-volatile storage elements of the set of NAND strings by reducing threshold voltages of the selected non-volatile storage elements below the erase threshold distribution, including establishing a programming voltage in channels associated with selected NAND strings of the set of NAND strings, wherein the one or more managing circuits being configured to program the selected non-volatile storage elements comprises the one or more managing circuits being configured to apply a sequence of voltages to a selected word line associated with the selected NAND strings and configured to apply a voltage to bit lines associated with the selected NAND strings that increases with later voltages in the sequence until a first of the selected non-volatile storage elements that is on a first of the selected NAND string is programmed.

8. The 3D stacked non-volatile memory device of claim 7, wherein each voltage in the sequence of voltages applied to the selected word line is lower than the voltage applied to the bit lines associated with the selected NAND strings.

9. The 3D stacked non-volatile memory device of claim 7, wherein the one or more managing circuits are further configured to apply an inhibit voltage to an unselected bit line that is associated with an unselected NAND string of the set of NAND strings, the one or more managing circuits are further configured to apply a voltage to a drain select gate associated with the unselected NAND string to pass the inhibit voltage to a channel of the unselected NAND string, the one or more managing circuits are further configured to apply a voltage to an unselected word line associated with the unselected NAND string to prevent programming of a non-volatile storage element on the unselected NAND string.

10. The 3D stacked non-volatile memory device of claim 7, wherein the one or more managing circuits being configured to establish the programming voltage in the channels associated with the selected NAND strings comprises the one or more managing circuits being configured to apply a voltage to drain side select gates of the selected NAND strings while the one or more managing circuits apply the voltage to the bit lines associated with the selected NAND strings to pass the programming voltage to the channels of the selected NAND strings, wherein the one or more managing circuits are further configured to apply a voltage in the sequence of voltages to the selected word line while the programming voltage is in the channels of the selected NAND strings.

11. The 3D stacked non-volatile memory device of claim 10, wherein the one or more managing circuits being configured to program the selected non-volatile storage elements comprises the one or more managing circuits being configured to apply a first voltage to any unselected word lines associated with the selected NAND strings that are between the selected word line and a source line associated with the selected NAND strings while the programming voltage is in the channels of the selected NAND strings to prevent programming of any non-volatile storage elements on the selected NAND strings that have already been programmed, wherein the one or more managing circuits are configured to apply a second voltage to any unselected word lines associated with the selected NAND strings that are between the selected word line and the bit lines of the selected NAND strings while the programming voltage is in the channels of the selected NAND strings, wherein the second voltage allows the programming voltage to pass to a channel of the selected non-volatile storage elements and prevents programming of any non-volatile storage elements on the selected NAND strings that are yet to be programmed.

12. The 3D stacked non-volatile memory device of claim 11, wherein the set of NAND strings are in a first block, a second set of the plurality of NAND strings are in a second block that is unselected, the drain side select gate of the NAND strings in the first block and the second block includes a first transistor and a second transistor, the first transistor is closer to the bit line associated with the NAND string than the second transistor, wherein the one or more managing circuits are configured to apply a voltage that is equal to the programming voltage to the first transistor of drain side select gates of NAND strings in the second block, the one or more managing circuits are configured to apply a voltage that is between 0V and 3V to the second transistor of drain side select gates of NAND strings in the second block, wherein the one or more managing circuits are configured to apply a voltage that is between 0V and 3V to all word lines in the second block.

13. The 3D stacked non-volatile memory device of claim 7, wherein the non-volatile storage elements on each of the plurality of NAND strings comprise thin film transistors.

14. A method of programming 3D stacked non-volatile storage, comprising a plurality of word lines comprising conductive material that is oriented horizontally, the conductive material alternates with dielectric material in a stack, a plurality of NAND strings that are oriented vertically, each NAND string comprising a set of non-volatile storage elements and a drain side select gate at a first end of each NAND string, a plurality of bit lines, each bit line coupled to the drain side select gate of a set of the plurality of NAND strings, the method comprising:
 erasing the non-volatile storage elements that are associated with the plurality of NAND strings, the erasing including:
 applying a first voltage to selected bit lines associated with selected NAND strings of the plurality of NAND strings, the selected bit lines associated with NAND strings that are selected for erase;
 applying a second voltage to all word lines associated with the plurality of NAND strings concurrently with applying the first voltage, the second voltage is greater than the first voltage; and
 applying a third voltage to unselected bit lines associated with unselected NAND strings of the plurality of NAND strings, the third voltage allows the second voltage to boost channel potentials of the unselected NAND string;
 after said erasing, applying a select voltage to drain side select gates of a group of NAND strings of the plurality of NAND strings while applying a programming voltage to a selected bit line associated with a selected NAND string of the group of NAND strings to pass the programming voltage to a channel of the selected NAND string;
 applying a fourth voltage to a selected word line associated with the selected NAND string while the programming voltage is in the channel of the selected NAND string, the selected NAND string having a selected non-volatile storage element associated with the selected word line;
 applying a fifth voltage to all unselected word lines associated with the selected NAND string that are between the selected word line and a source select gate while the programming voltage is in the channel of the selected NAND string to prevent programming of any non-volatile storage elements on the selected NAND string that have already been programmed; and
 applying a sixth voltage to all unselected word lines associated with the selected NAND string that are between the selected word line and the drain select gate of the selected NAND string while the programming voltage is in the channel of the selected NAND string, the third voltage allows the programming voltage to pass to a channel of the selected non-volatile storage element and prevents programming of any non-volatile storage element on the selected NAND string between the selected word line and the drain side select gate.

15. The method of claim 14, further comprising:
 applying an inhibit voltage to an unselected bit line associated with an unselected NAND string of the group of NAND strings, the applying a select voltage to select gates passes the inhibit voltage to a channel of the unselected NAND string to inhibit programming of non-volatile storage elements on the unselected NAND string.

16. The method of claim 14, wherein the plurality of NAND strings are in a first block that is selected, the 3D stacked non-volatile storage further comprises a second block having a plurality of NAND strings and a plurality of word lines, each NAND string in the second block comprising a set of non-volatile storage elements and a drain side select gate at a first end of each NAND string, the drain side select gate of the NAND strings in the second block including a first transistor and a second transistor, the first transistor is closer to a bit line associated with the NAND string than the second transistor, a first NAND string in the second block shares a bit line with the selected NAND string in the first block, and further comprising:
 applying a voltage that is equal to the programming voltage to the first transistor of drain side select gates of NAND strings in the second block;
 applying an inhibit voltage to the second transistor of drain side select gates of NAND strings in the second block; and
 applying the inhibit voltage to all word lines in the second block.

17. The method of claim 14, wherein the erasing further comprises:
 applying a voltage to the select gates of the plurality of NAND strings that turns on the select gates of the selected NAND strings to pass the first voltage to the channels of the selected NAND strings and that keeps off the select gates of the unselected NAND strings.

18. A 3D stacked non-volatile memory device, comprising:
 a substrate;
 a plurality of bit lines;
 a plurality of source lines;
 a plurality of word lines comprising conductive material that is oriented horizontally with respect to the substrate;
 a plurality of layers of dielectric material that alternates with the plurality of word lines in a stack;
 a plurality of NAND strings that are oriented vertically with respect to the substrate, each NAND string comprising a set of non-volatile storage elements, a drain side select gate at a first end of the NAND string, and a source side select gate at a second end of the NAND string, the drain side select gate of each NAND string coupled to one of the bit lines, the source side select gate of each NAND string coupled to one of the source lines, wherein the drain side select gate of a respective NAND string includes a first select transistor and a second select transistor, wherein the first select transistor is closer to the bit line associated with the respective NAND string, wherein the plurality of NAND strings comprise a first block of NAND strings and a second block of NAND strings, wherein the NAND strings in the second block share bit lines with the NAND strings in the first block;

one or more managing circuits in communication with the plurality of word lines, the plurality of bit lines, the plurality of source lines, the drain side select gates, and the source side select gates, the one or more managing circuits apply a select voltage to drain side select gates of a group of NAND strings of the first block of NAND strings while applying a program voltage to selected bit lines associated with selected NAND strings of the group of NAND strings to pass the program voltage to channels of the respective selected NAND strings, the one or more managing circuits apply a first voltage to a selected word line associated with the group of NAND strings while the program voltage is in the channels of the selected NAND strings, the one or more managing circuits apply a second voltage to all unselected word lines associated with the selected NAND strings that are between the selected word line and the source select gates of the selected NAND strings while the program voltage is in the channels of the selected NAND strings to prevent programming of any non-volatile storage elements on the selected NAND strings that have already been programmed, the one or more managing circuits apply a third voltage to all unselected word lines associated with the selected NAND strings that are between the selected word line and the drain select gates of the selected NAND strings while the program voltage is in the channels of the selected NAND strings, the third voltage allows the program voltage to pass to channels of selected non-volatile storage elements and prevents programming of any non-volatile storage element on the selected NAND strings between the selected word line and the drain side select gate, wherein the one or more managing circuits apply the program voltage to bit lines associated with a group of NAND strings in the second block that is not selected for programming while programming the NAND strings in the first block, wherein the bit lines associated with the group of NAND strings in the second block are the same bit lines as the selected bit lines associated with the selected NAND strings in the first block, wherein the one or more managing circuits apply the program voltage to the first select transistor in the second block, the one or more managing circuits apply a ground voltage to the second select transistor in the second block.

19. The 3D stacked non-volatile memory device of claim 18, wherein the one or more managing circuits apply a fourth voltage to the source line while applying a fifth voltage to the source side select gates of the group of NAND strings, the fourth voltage is larger than the fifth voltage.

20. The 3D stacked non-volatile memory device of claim 18, wherein the one or more managing circuits apply an inhibit voltage to an unselected bit line associated with an unselected NAND string of the group of NAND strings, the applying a select voltage to select gates passes the inhibit voltage to a channel of the unselected NAND string to inhibit programming of non-volatile storage elements on the unselected NAND string.

21. The 3D stacked non-volatile memory device of claim 18, wherein the one or more managing circuits apply a voltage of between ground and 3V to the word lines in the second block.

22. A method of programming 3D stacked non-volatile storage, comprising a plurality of word lines comprising conductive material that is oriented horizontally, the conductive material alternates with dielectric material in a stack, a plurality of NAND strings that are oriented vertically, each NAND string comprising a set of non-volatile storage elements and a drain side select gate at a first end of each NAND string, a plurality of bit lines, each bit line coupled to the drain side select gate of a set of the plurality of NAND strings, wherein the plurality of NAND strings are in a first block, the 3D stacked non-volatile storage further comprises a second block having a plurality of NAND strings and a plurality of word lines, each NAND string in the second block comprising a set of non-volatile storage elements and a drain side select gate at a first end of each NAND string, the drain side select gate of the NAND strings in the second block including a first transistor and a second transistor, the first transistor is closer to a bit line associated with the NAND string than the second transistor, a first NAND string in the second block shares a bit line with a selected NAND string in the first block, the method comprising:

applying a select voltage to drain side select gates of a group of NAND strings of the plurality of NAND strings while applying a programming voltage to a selected bit line associated with the selected NAND string in the first block to pass the programming voltage to a channel of the selected NAND string;

applying a first voltage to a selected word line associated with the selected NAND string while the programming voltage is in the channel of the selected NAND string, the selected NAND string having a selected non-volatile storage element associated with the selected word line;

applying a second voltage to all unselected word lines associated with the selected NAND string that are between the selected word line and a source select gate while the programming voltage is in the channel of the selected NAND string to prevent programming of any non-volatile storage elements on the selected NAND string that have already been programmed;

applying a third voltage to all unselected word lines associated with the selected NAND string that are between the selected word line and the drain select gate of the selected NAND string while the programming voltage is in the channel of the selected NAND string, the third voltage allows the programming voltage to pass to a channel of the selected non-volatile storage element and prevents programming of any non-volatile storage element on the selected NAND string between the selected word line and the drain side select gate;

applying a voltage that is equal to the programming voltage to the first transistor of drain side select gates of NAND strings in the second block;

applying an inhibit voltage to the second transistor of drain side select gates of NAND strings in the second block; and applying the inhibit voltage to all word lines in the second block.

* * * * *